(12) United States Patent
Takakura et al.

(10) Patent No.: US 11,183,448 B2
(45) Date of Patent: Nov. 23, 2021

(54) WIRING CIRCUIT BOARD AND IMAGING DEVICE

(71) Applicant: NITTO DENKO CORPORATION, Osaka (JP)

(72) Inventors: Hayato Takakura, Osaka (JP); Shuichi Wakaki, Osaka (JP); Shusaku Shibata, Osaka (JP); Yoshihiro Kawamura, Osaka (JP); Masaki Ito, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/607,612

(22) PCT Filed: Apr. 23, 2018

(86) PCT No.: PCT/JP2018/016447
§ 371 (c)(1),
(2) Date: Oct. 23, 2019

(87) PCT Pub. No.: WO2018/199017
PCT Pub. Date: Nov. 1, 2018

(65) Prior Publication Data
US 2020/0075474 A1  Mar. 5, 2020

(30) Foreign Application Priority Data

Apr. 28, 2017 (JP) .............................. JP2017-090149
Sep. 29, 2017 (JP) .............................. JP2017-191030

(51) Int. Cl.
*H01L 23/498* (2006.01)
*H01L 27/146* (2006.01)
(Continued)

(52) U.S. Cl.
CPC ...... *H01L 23/49838* (2013.01); *H01L 21/481* (2013.01); *H01L 21/4857* (2013.01);
(Continued)

(58) Field of Classification Search
CPC ......... H01L 23/49838; H01L 23/49822; H01L 23/552; H01L 21/481; H01L 21/4857; H01L 27/14636
See application file for complete search history.

(56) References Cited

U.S. PATENT DOCUMENTS 5,294,755 A    3/1994  Kawakami et al.
2006/0096781 A1  5/2006  Yamano
(Continued)

FOREIGN PATENT DOCUMENTS

JP    H02-241077 A    9/1990
JP    H04-241496 A    8/1992
(Continued)

OTHER PUBLICATIONS

International Preliminary Report on Patentability issued by WIPO dated Oct. 29, 2019, in connection with International Patent Application No. PCT/JP2018/016447.
(Continued)

*Primary Examiner* — Christine A Enad
(74) *Attorney, Agent, or Firm* — Edwards Neils LLC; Jean C. Edwards, Esq.

(57) ABSTRACT

A wiring circuit board includes a first insulating layer, a terminal, a second insulating layer disposed at one side in a thickness direction of the terminal, and a wire continuous to the terminal in a direction crossing the thickness direction. The first insulating layer has an opening portion passing through the first insulating layer in the thickness direction and having the opening cross-sectional area increasing as being closer to one side in the thickness direction. The terminal has a peripheral end portion and a solid portion. The peripheral end portion contacts with an inner side surface of the first insulating layer. The inner side surface forms the opening portion. The solid portion integrally disposed with the peripheral end portion at the inner side of the peripheral
(Continued)

end portion. The peripheral end portion and the solid portion fill the entire opening portion.

8 Claims, 16 Drawing Sheets

(51) Int. Cl.
H01L 23/552 (2006.01)
H01L 23/00 (2006.01)
H01L 21/48 (2006.01)
H04N 5/225 (2006.01)

(52) U.S. Cl.
CPC ...... *H01L 23/49822* (2013.01); *H01L 23/552* (2013.01); *H01L 24/16* (2013.01); *H01L 27/14636* (2013.01); *H04N 5/2253* (2013.01); *H01L 2224/16227* (2013.01)

(56) References Cited

U.S. PATENT DOCUMENTS

| | | | |
|---|---|---|---|
| 2016/0278214 A1* | 9/2016 | Hayashi | H05K 1/186 |
| 2017/0354034 A1 | 12/2017 | Hitsuoka | |
| 2018/0054890 A1* | 2/2018 | Ishihara et al. | H05K 1/113 |
| 2018/0054891 A1* | 2/2018 | Ishihara et al. | H05K 1/113 |
| 2018/0168039 A1* | 6/2018 | Numagi et al. | H05K 1/113 |
| 2018/0242462 A1* | 8/2018 | Minegishi et al. | H05K 3/34 |

FOREIGN PATENT DOCUMENTS

| | | |
|---|---|---|
| JP | 2004-221388 A | 8/2004 |
| JP | 2005-210628 A | 8/2005 |
| JP | 2006-135174 A | 5/2006 |
| JP | 2010-171275 A | 8/2010 |
| WO | 2016/136222 A1 | 9/2016 |

OTHER PUBLICATIONS

International Search Report Issued in PCT/JP2018/016447 dated Jul. 24, 2018.

Written Opinion Issued in PCT/JP2018/016447 dated Jul. 24, 2018.

Office Action, issued by the Taiwanese Intellectual Property Office dated Aug. 19, 2021, in connection with Taiwanese Patent Application No. 107114196.

* cited by examiner

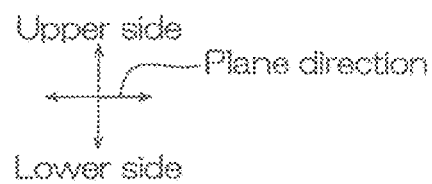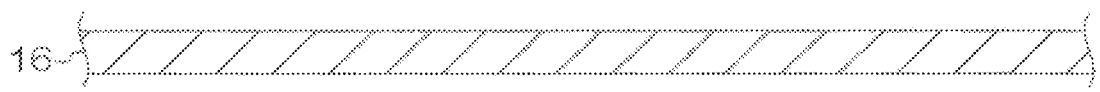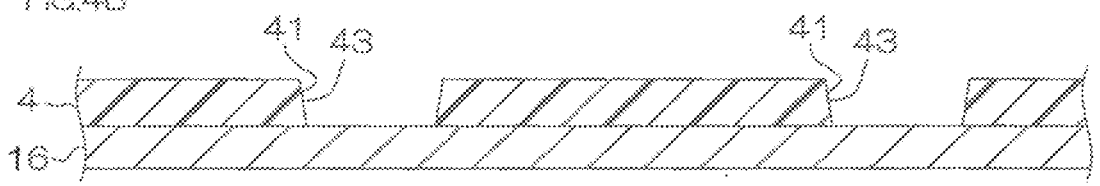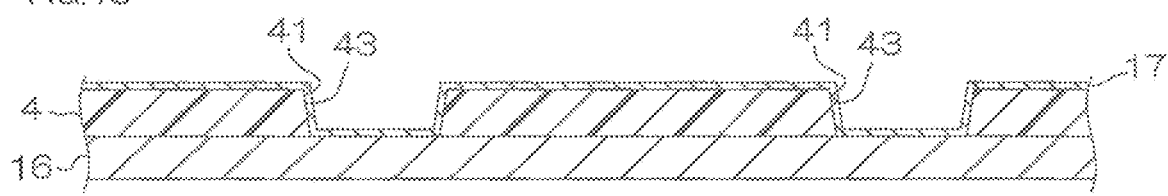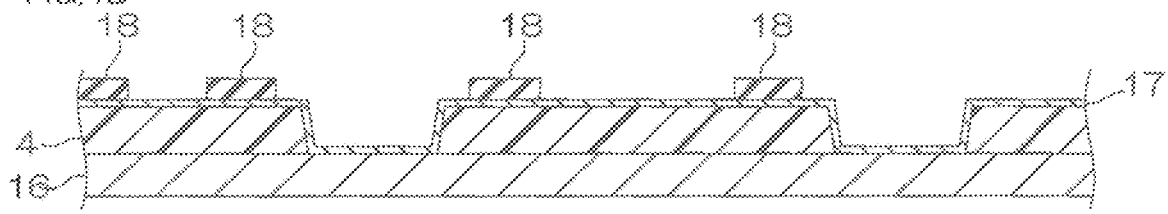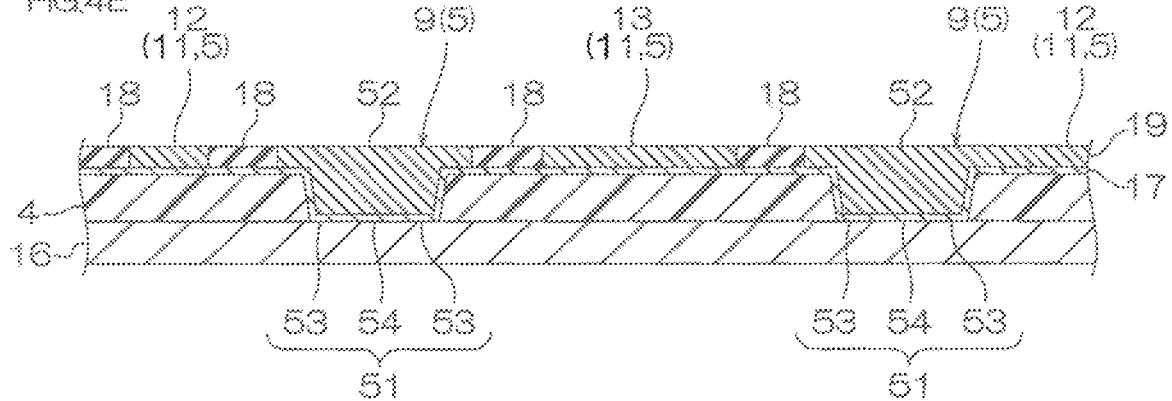

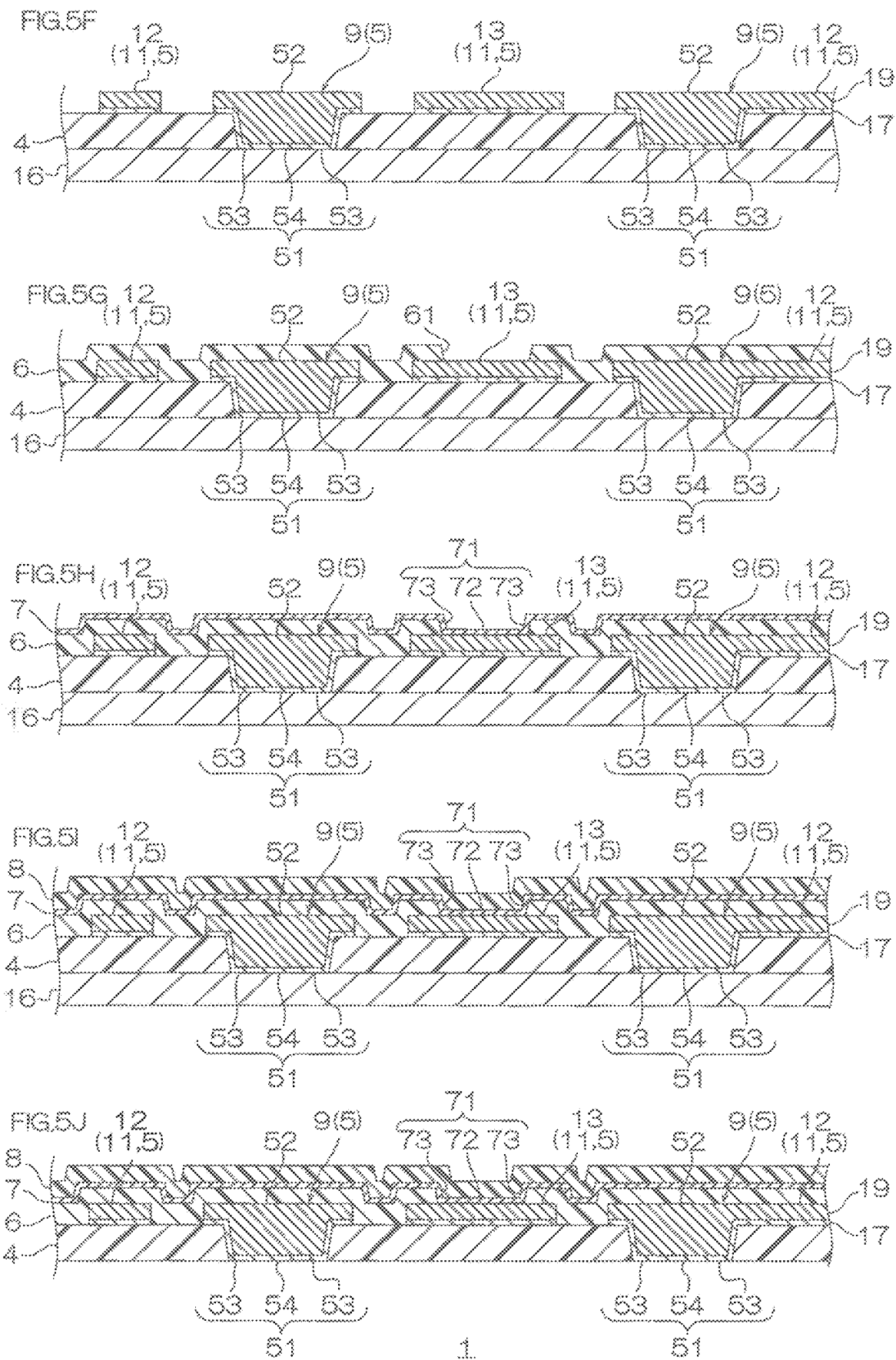

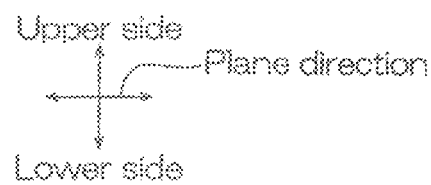
FIG.14A
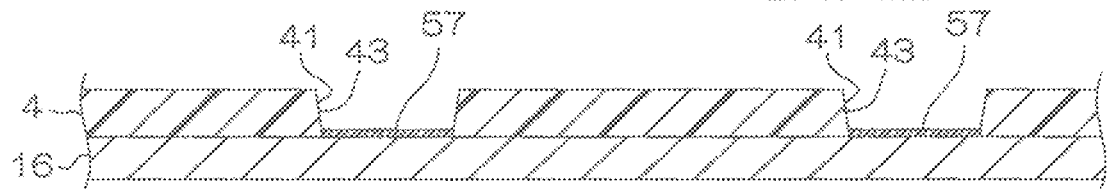
FIG.14B
FIG.14C
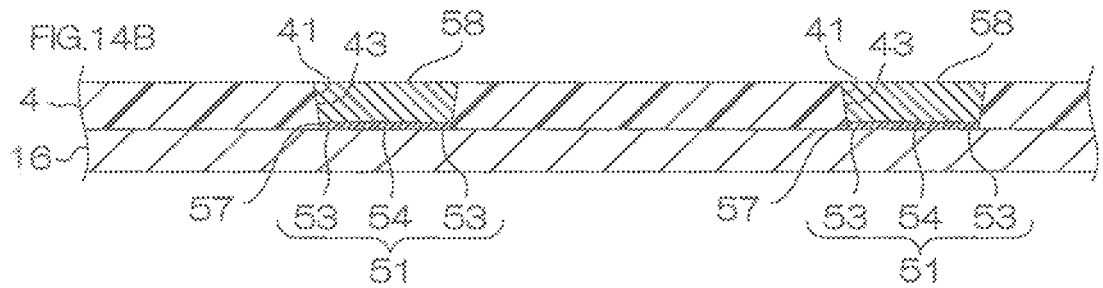
FIG.14D
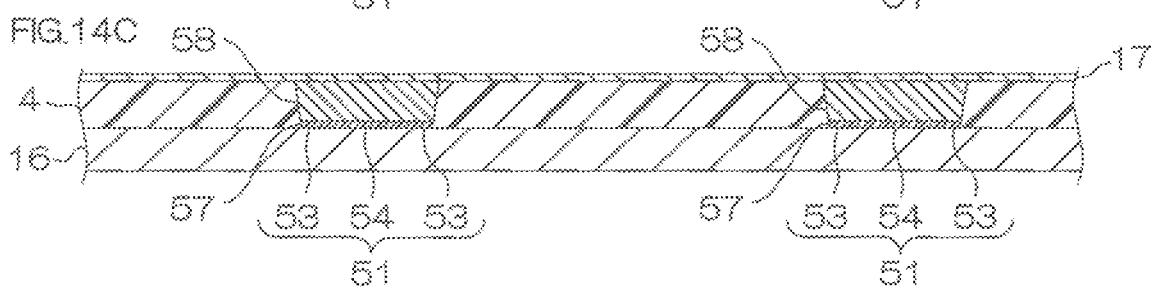
FIG.14E
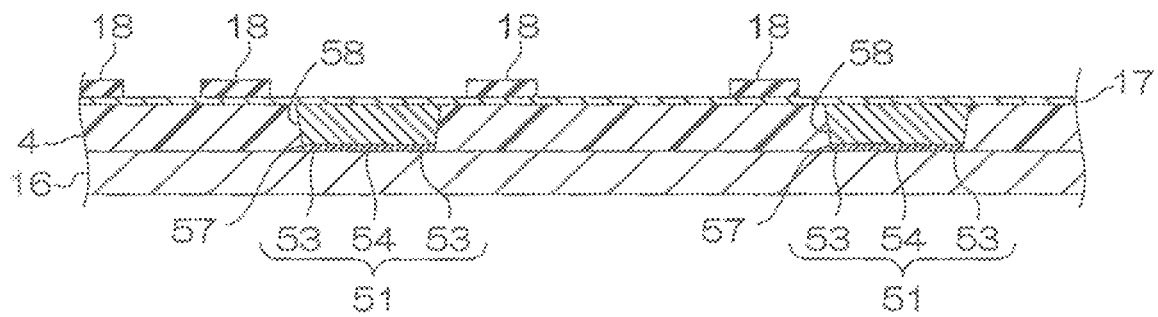

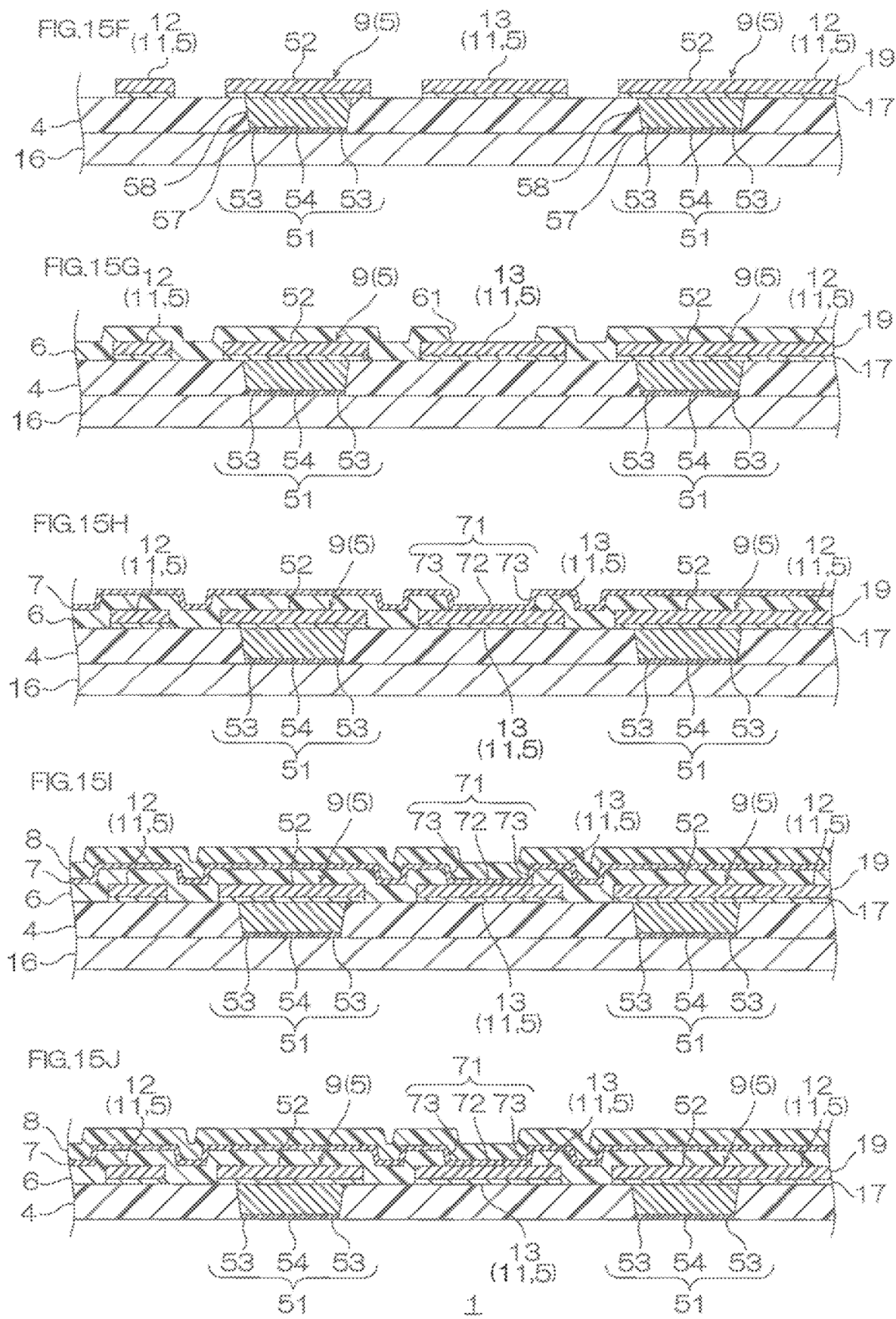

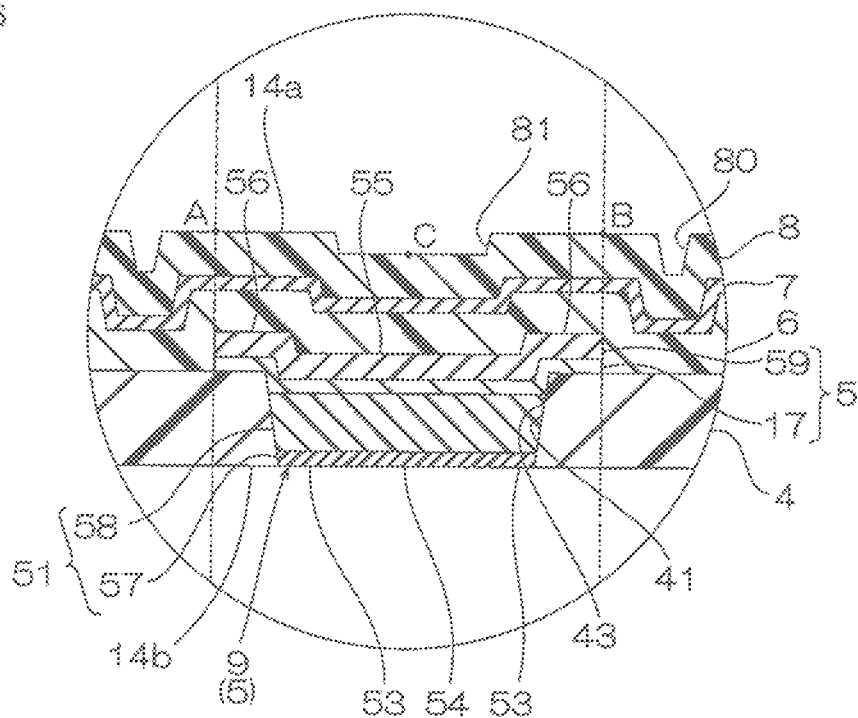

FIG.17
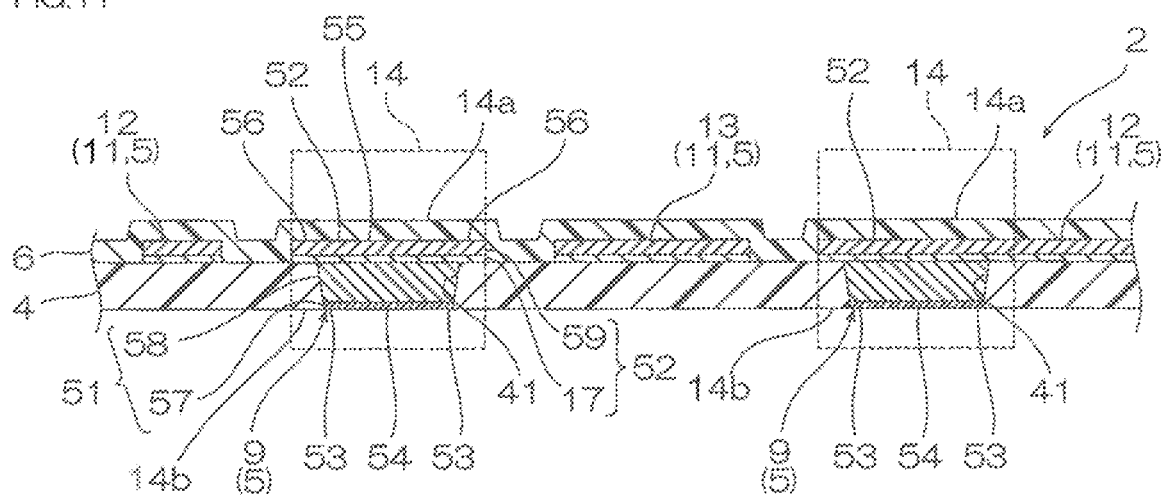
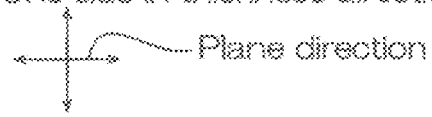

WIRING CIRCUIT BOARD AND IMAGING DEVICE

CROSS-REFERENCE TO RELATED APPLICATIONS

The present application is a 35 U.S.C. 371 National Stage Entry of PCT/JP2018/016447, filed on Apr. 23, 2018, which claims priority from Japanese Patent Application No. 2017-090149, filed on Apr. 28, 2017, and Japanese Patent Application No. 2017-191030, filed on Sep. 29, 2017, the contents of all of which are herein incorporated by reference in their entirety.

TECHNICAL FIELD

The present invention relates to a wiring circuit board and an imaging device.

BACKGROUND ART

Conventionally, an imaging device such as camera module mounted on a cellular phone or the like has been generally mounted with an optical lens, a housing that houses and retains the optical lens, an imaging element such as CMOS sensor and CCD sensor, and an imaging element-mounting board that is mounted with the imaging element for being electrically connected to an external wire. The imaging element is mounted on a generally central portion of the imaging element-mounting board, and the housing is disposed on a peripheral end portion of the imaging element-mounting board so as to surround the imaging element. Patent Document 1 discloses the board.

CITATION LIST

Patent Document

Patent Document 1: Japanese Unexamined Patent Publication No. 2005-210628

SUMMARY OF THE INVENTION

Problem to be Solved by the Invention

The imaging device used in the cellular phone or the like is required to further reduce its thickness (height) along with a demand for a smaller cellular phone. One of the methods of reducing the height of the imaging device includes a reduction in thickness of the imaging element-mounting board.

Generally, in the imaging element-mounting board, two types of a rigid-type wiring circuit board that reinforces the entire rear surface thereof with a metal plate or the like and a thin flexible-type wiring circuit board (FPC) that does not reinforce the entire lower surface thereof with the metal plate are used.

The FPC is not reinforced with the metal plate, so that a reduction in thickness thereof is possible compared to the rigid-type wiring circuit board. However, the FPC has a thin film, so that unevenness caused by a conductive pattern such as wire and terminal is formed on the upper surface or the lower surface of the FPC. Also, the FPC has flexibility. Accordingly, when a plurality of terminals of an electronic element such as an imaging element are mounted on the terminals of the FPC respectively, one or more terminal regions may be deformed in a thickness direction to be recessed. Then, there is a disadvantage that the imaging element is inclined, so that the mounting accuracy of the imaging element is reduced.

At the time of the mounting, a pressure in the thickness direction is applied to the terminal, so that when the terminal is slender or thin, the terminal may be damaged.

The present invention provides a wiring circuit board having excellent mounting accuracy of an electronic element and capable of suppressing damage of a terminal, and an imaging device.

Means for Solving the Problem

The present invention [1] includes a wiring circuit board including a first insulating layer, a terminal, a second insulating layer disposed at one side in a thickness direction of the terminal, and a wire continuous to the terminal in a direction crossing the thickness direction, wherein the first insulating layer has an opening portion passing through the first insulating layer in the thickness direction and having the opening cross-sectional area increasing as being closer to one side in the thickness direction; the terminal has a peripheral end portion in contact with an inner side surface of the first insulating layer, the inner side surface forming the opening portion, and a solid portion integrally disposed with the peripheral end portion at the inner side of the peripheral end portion; and the peripheral end portion and the solid portion fill the entire opening portion.

According to the wiring circuit board, the terminal fills the entire opening portion in the first insulating layer, so that a terminal region on which an electronic element such as imaging element is mounted is reinforced by the solid portion. Accordingly, when the electronic element is mounted on the wiring circuit board, the deformation of the terminal region of the wiring circuit board in the thickness direction can be suppressed, and as a result, the electronic element can be accurately mounted on the wiring circuit board. Also, a supporting board such as metal supporting plate is not required, so that a reduction in thickness is possible.

The opening portion has the opening cross-sectional area that increases as being closer to one side in the thickness direction, and the terminal fills the opening portion. Thus, the terminal has a wide shape in which the cross-sectional area increases as it is closer to one side in the thickness direction, and has a sufficient thickness. Thus, the terminal can receive a stress acting on the other side in the thickness direction of the terminal at the time of the mounting, while dispersing the stress more at portions near to one side in the thickness direction. Thus, the damage of the terminal can be suppressed.

The present invention [2] includes the wiring circuit board described in [1], wherein the other-side surface in the thickness direction of the terminal is generally flush with the other-side surface in the thickness direction of the first insulating layer.

According to the wiring circuit board, the electronic element can be easily mounted on the other side in the thickness direction of the board, so that the mounting properties are excellent.

The present invention [3] includes the wiring circuit board described in [1] or [2], wherein a one-side surface in the thickness direction of the wiring circuit board that is, when the terminal is projected in the thickness direction, overlapped with the terminal is generally flat.

According to the wiring circuit board, when the electronic element is mounted on the wiring circuit board, the deformation of the terminal region of the wiring circuit board in the thickness direction can be furthermore surely suppressed.

The present invention [4] includes the wiring circuit board described in any one of [1] to [3], wherein the terminal includes a wire connecting portion integrally disposed with the peripheral end portion and the solid portion at one side in the thickness direction of the peripheral end portion and the solid portion, and a one-side surface in the thickness direction of the wire is generally flush with a one-side surface in the thickness direction of the wire connecting portion.

According to the wiring circuit board, the terminal includes the terminal connecting portion that is flush with the one-side surface in the thickness direction of the wire, so that the terminal region is furthermore reinforced by the terminal connecting portion. Accordingly, the deformation of the terminal region in the thickness direction can be furthermore suppressed. Also, the one-side surfaces in the thickness direction of the wire and the wire connecting portion are generally flush with each other, so that the one-side surface in the thickness direction of the wiring circuit board can be furthermore formed flat. Thus, the deformation of the wiring circuit board can be furthermore suppressed.

The present invention [5] includes the wiring circuit board described in any one of [1] to [4], wherein the terminal includes an inner side portion included in the opening portion when projected in the thickness direction and an outer side portion extending from the inner side portion outwardly, and a one-side surface in the thickness direction of the inner side portion is generally flush with a one-side surface in the thickness direction of the outer side portion.

According to the wiring circuit board, the inner side portion of the terminal is generally flush with the outer side portion, so that the one-side surface in the thickness direction of the wiring circuit board can be furthermore formed flat. Accordingly, the deformation of the wiring circuit board can be furthermore suppressed.

The present invention [6] includes the wiring circuit board described in any one of [1] to [5], wherein the terminal has a thickness of 30 µm or less.

According to the wiring circuit board, a reduction in thickness of the terminal, and accordingly, a reduction in thickness of the wiring circuit board can be achieved.

The present invention [7] includes the wiring circuit board described in any one of [1] to [6], wherein the terminal further includes a gold plating layer disposed at the inside of the opening portion and exposed from the other-side surface in the thickness direction of the opening portion.

According to the wiring circuit board, the gold plating layer is provided at the other-side surface in the thickness direction, so that the durability of the terminal is excellent. The gold plating layer has excellent etching resistance, so that in a step of exposing the other-side surface of the terminal by etching or the like, the entry of etching into the inside of the solid portion can be suppressed. Thus, the damage of the terminal can be suppressed. Furthermore, the gold plating layer is disposed at the inside of the opening portion, so that the protrusion of the gold plating layer from the other-side surface in the thickness direction of the wiring circuit board can be suppressed, and the mounting properties of the electronic element are excellent.

The present invention [8] includes the wiring circuit board described in any one of [1] to [7] further including a shield layer disposed at one side in the thickness direction of the second insulating layer and a third insulating layer disposed at one side in the thickness direction of the shield layer.

According to the wiring circuit board, electromagnetic waves generated from the outside can be shielded by the shield layer, so that the reliability of the imaging device can be improved.

The present invention [9] includes the wiring circuit board described in any one of [1] to [8] used for mounting an imaging element.

The wiring circuit board can be used as a wiring circuit board for mounting the imaging element.

The present invention [10] includes an imaging device including the wiring circuit board described in any one of [1] to [9] and an imaging element mounted on the wiring circuit board.

According to the imaging device, the above-described wiring circuit board and imaging element are provided, so that the deformation in the thickness direction in the terminal region of the wiring circuit board is suppressed. Thus, the imaging element is accurately mounted on the wiring circuit board, and the connection reliability is excellent. Also, a supporting board such as metal supporting plate is not required, so that a reduction in thickness is possible. Furthermore, the damage of the terminal is suppressed.

Effect of the Invention

The wiring circuit board and the imaging device of the present invention have excellent mounting accuracy of the electronic element, and the damage of the terminal can be suppressed.

BRIEF DESCRIPTION OF THE DRAWINGS

FIG. 3A illustrating a view of a peripheral end portion and a solid portion shown by a phantom line in a terminal connecting portion of the imaging element connecting terminal, and FIG. 3B illustrating a view of an inner side portion and an outer side portion shown by the phantom line in the imaging element connecting terminal.

FIGS. 4A to 4E show production process views of the imaging element-mounting board shown in FIG. 1:

FIG. 4A illustrating a step of preparing a metal supporting plate,

FIG. 4B illustrating a step of forming a base insulating layer,

FIG. 4C illustrating a step of forming a metal thin film,

FIG. 4D illustrating a step of forming a photo resist, and

FIG. 4E illustrating a step of forming a conductive pattern.

FIGS. 5F to 5J, subsequent to FIG. 4, show production process views of the imaging element-mounting board shown in FIG. 1:

FIG. 5F illustrating a step of removing a photo resist and metal thin film,

FIG. 5G illustrating a step of forming a first cover insulating layer,

FIG. 5H illustrating a step of forming a shield layer,

FIG. 5I illustrating a step of forming a second cover insulating layer, and

FIG. 5J illustrating a step of removing a metal supporting plate.

FIG. 8A illustrating the imaging element-mounting board before the mounting, and FIG. 8B illustrating an imaging device after the mounting.

FIG. 9A illustrating the imaging element-mounting board before the mounting, and FIG. 9B illustrating an imaging device after the mounting.

FIG. 13A illustrating a view of a peripheral end portion and a solid portion shown by a phantom line in a terminal connecting portion of the imaging element connecting terminal, and FIG. 13B illustrating a view of an inner side portion and an outer side portion shown by the phantom line in the imaging element connecting terminal.

FIGS. 14A to 14E show production process views of the imaging element-mounting board shown in FIG. 12:

FIG. 14A illustrating a step of forming a gold plating layer,

FIG. 14B illustrating a step of forming a filling portion,

FIG. 14C illustrating a step of forming a metal thin film,

FIG. 14D illustrating a step of forming a photo resist, and

FIG. 14E illustrating a step of forming a conductive pattern.

FIGS. 15F to 15J, subsequent to FIG. 14, show production process views of the imaging element-mounting board shown in FIG. 12:

FIG. 15F illustrating a step of removing a photo resist and metal thin film,

FIG. 15G illustrating a step of forming a first cover insulating layer,

FIG. 15H illustrating a step of forming a shield layer,

FIG. 15I illustrating a step of forming a second cover insulating layer, and

FIG. 15J illustrating a step of removing a metal supporting plate.

FIG. 16 shows a cross-sectional view of a modified example (embodiment in which a shield layer and a second cover insulating layer are not provided) of the second embodiment of the imaging element-mounting board of the present invention.

FIG. 17 shows a modified example (embodiment in which a shield layer and a second cover insulating layer are not provided) of the second embodiment of the imaging element-mounting board of the present invention.

DESCRIPTION OF EMBODIMENTS

Figure 1:
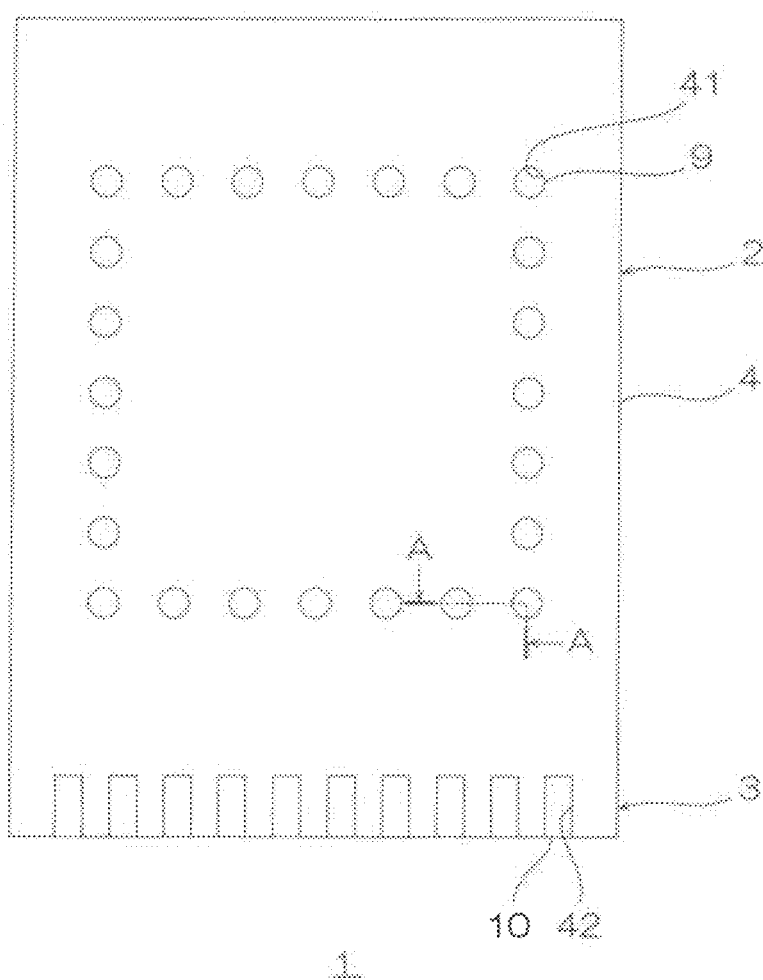
FIG. 1 shows a bottom view of a first embodiment of an imaging element-mounting board of the present invention.

In FIG. 1, the up-down direction on the plane of the sheet is a front-rear direction (first direction), the upper side on the plane of the sheet is a front side (one side in the first direction), and the lower side on the plane of the sheet is a rear side (the other side in the first direction). The right-left direction on the plane of the sheet is a right-left direction (second direction perpendicular to the first direction), the left side on the plane of the sheet is a left side (one side in the second direction), and the right side on the plane of the sheet is a right side (the other side in the second direction). The paper thickness direction on the plane of the sheet is an up-down direction (thickness direction, a third direction perpendicular to the first direction and the second direction), the far side on the plane of the sheet is an upper side (one side in the thickness direction, one side in the third direction), and the near side on the plane of the sheet is a lower side (the other side in the thickness direction, the other side in the third direction). To be specific, directions are in conformity with direction arrows described in each view.

First Embodiment

1. Imaging Element-Mounting Board

A first embodiment of an imaging element-mounting board (hereinafter, may be simply referred to as a mounting board) as one embodiment of a wiring circuit board of the present invention is described with reference to FIGS. 1 to 3B.

A mounting board 1 of the first embodiment is a flexible wiring circuit board (FPC) for mounting an imaging element 21 (described later), and does not include the imaging element 21 yet. As shown in FIG. 1, the mounting board 1 has a generally rectangular (rectangle-shaped) flat plate shape (sheet shape) when viewed from the top extending in the front-rear direction and the right-left direction (plane direction).

As shown in FIG. 1, the mounting board 1 includes a housing disposed portion 2 and an external component connecting portion 3.

The housing disposed portion 2 is a portion in which a housing 22 (described later) and the imaging element 21 are disposed. To be specific, in a case where the housing 22 is disposed in the mounting board 1, the housing disposed portion 2 is a portion that is overlapped with the housing 22 when projected in the thickness direction. A plurality of imaging element connecting terminals 9 (described later) for being electrically connected to the imaging element 21 are disposed in a generally central portion of the housing disposed portion 2. The housing disposed portion 2 does not have a metal supporting plate to be described later.

The external component connecting portion 3 is a region other than the housing disposed portion 2, and a portion for being connected to an external component. The external component connecting portion 3 is disposed at the rear side of the housing disposed portion 2 so that the front end edge thereof is continuous to the rear end edge of the housing disposed portion 2. In the rear end edge of the external component connecting portion 3, a plurality of external component connecting terminals 10 (described later) for being electrically connected to the external component are disposed.

Figure 2:
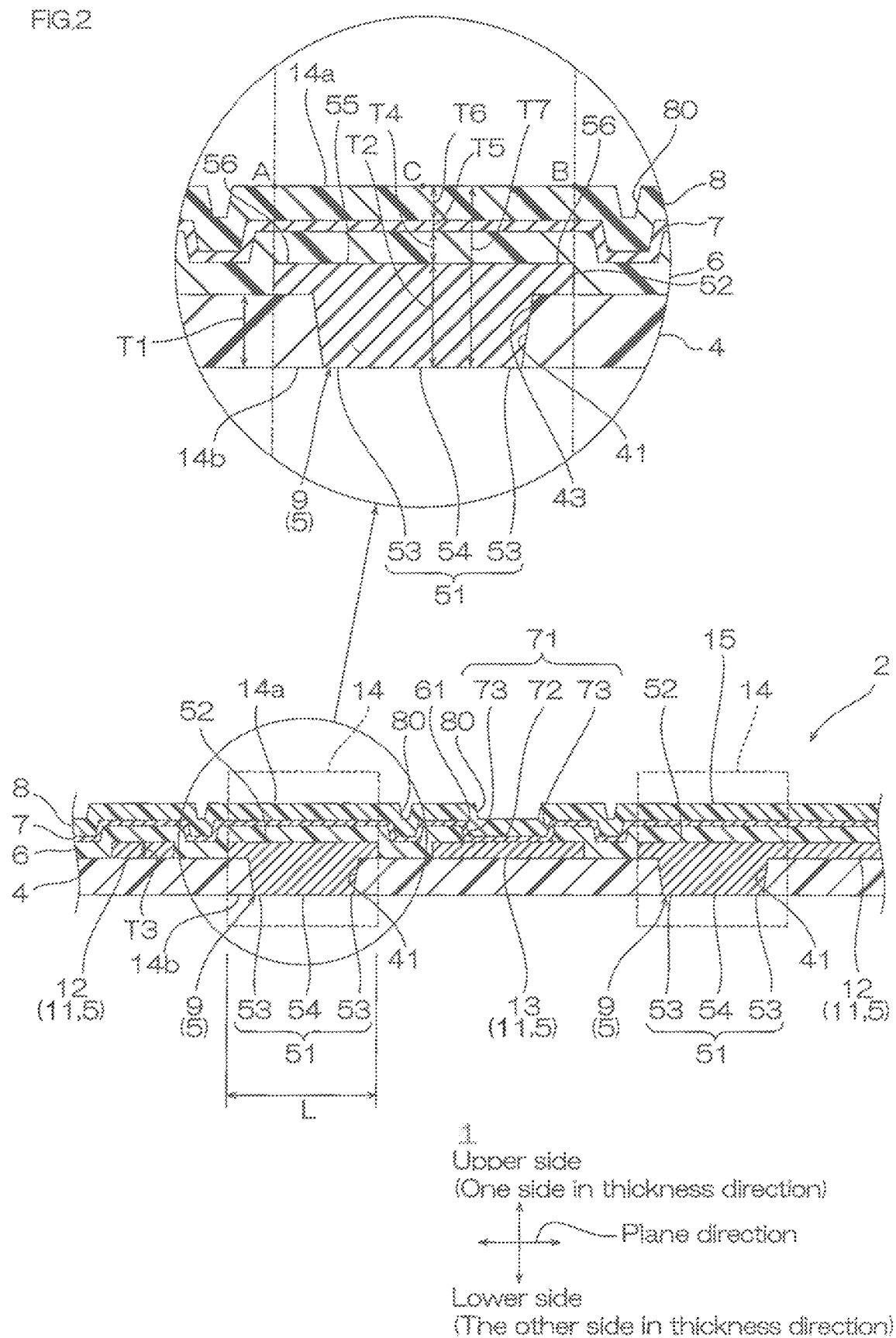
FIG. 2 shows an A-A cross-sectional view in the imaging element-mounting board shown in FIG. 1.

As shown in FIG. 2, the mounting board 1 includes a base insulating layer 4 as a first insulating layer, a conductive pattern 5, a first cover insulating layer 6 as a second insulating layer, a shield layer 7, and a second cover insulating layer 8 as a third insulating layer. Preferably, the mounting board 1 consists of only the base insulating layer 4, the conductive pattern 5, the first cover insulating layer 6, the shield layer 7, and the second cover insulating layer 8.

The base insulating layer 4 forms the outer shape of the mounting board 1, and has a generally rectangular shape when viewed from the bottom. The lower surface (the other-side surface in the thickness direction) of the base insulating layer 4 is formed generally flat. In the base insulating layer 4, a plurality of imaging element opening portions 41 (opening portion) and a plurality of external component opening portions 42 are formed.

The plurality of imaging element opening portions 41 are opening portions for exposing the imaging element connecting terminals 9 from the lower surface. The plurality of imaging element opening portions 41 are disposed in alignment at spaced intervals to each other so as to have a rectangular frame shape in the central portion of the housing disposed portion 2. Each of the imaging element opening portions 41 has a generally circular shape when viewed from the bottom passing through the base insulating layer 4 in the thickness direction. The imaging element opening portion 41 has a shape in which the opening cross-sectional area increases as it is closer to the upper side. That is, the imaging element opening portion 41 has a tapered shape in which the width thereof increases as it is closer to the upper side (the width thereof decreases as it is closer to the lower side) when viewed in side cross section. The imaging element opening portion 41 is defined from an inner side surface 43 of the base insulating layer 4, and an angle made between the inner side surface 43 of the base insulating layer 4 and the lower surface of the imaging element opening portion 41 is, for example, 100° or more, preferably 120° or more, and for example, 170° or less, preferably 160° or less when viewed in side cross section. In this manner, in a producing method to be described later, a metal thin film 17 is uniformly formed at the inside of the imaging element opening portion 41, and the tapered imaging element connecting terminal 9 can be surely formed.

The plurality of external component opening portions 42 are opening portions for exposing the external component connecting terminals 10 from the lower surface. The external component opening portions 42 are disposed in alignment at spaced intervals to each other in the right-left direction in the rear end edge of the external component connecting portion 3. Each of the external component opening portions 42 has a generally rectangular shape (rectangle-shaped) when viewed from the bottom passing through the base insulating layer 4 in the thickness direction. The external component opening portion 42 is formed so as to extend from the rear end edge of the external component connecting portion 3 forwardly when viewed from the bottom.

The base insulating layer 4 is formed from an insulating material. Examples of the insulating material include synthetic resins such as polyimide resin, polyamide imide resin, acrylic resin, polyether nitrile resin, polyether sulfone resin, polyethylene terephthalate resin, polyethylene naphthalate resin, and polyvinyl chloride resin. Preferably, the base insulating layer 4 is formed from a polyimide resin.

The base insulating layer 4 has a thickness $T_1$ of, for example, 1 μm or more, preferably 3 μm or more, more preferably 5 μm or more, and for example, 30 μm or less, preferably 10 μm or less, more preferably 8 μm or less.

The conductive pattern 5 is provided at the upper side of the base insulating layer 4 so as to be in contact with the upper surface (one-side surface in the thickness direction) of the base insulating layer 4. The conductive pattern 5 includes the plurality of imaging element connecting terminals 9 (terminal), the plurality of external component connecting terminals 10, and a plurality of wires 11.

The plurality of imaging element connecting terminals 9 are disposed in alignment at spaced intervals to each other so as to be in a rectangular frame shape in the central portion of the housing disposed portion 2. That is, the plurality of imaging element connecting terminals 9 are provided so as to correspond to a plurality of terminals 25 (described later) of the imaging element 21 to be mounted. The plurality of imaging element connecting terminals 9 are provided corresponding to the plurality of imaging element opening portions 41.

The imaging element connecting terminal 9 has a generally inverted hat shape when viewed in cross section, and integrally includes a terminal connecting portion 51 and a wire connecting portion 52 that is disposed thereon.

The terminal connecting portion 51 is a portion that is connected to a solder bump 26 (described later), and forms the lower portion of the imaging element connecting terminal 9. The terminal connecting portion 51 is disposed at the inside of the imaging element opening portion 41.

The terminal connecting portion 51 has a shape in which the opening cross-sectional area increases as it is closer to the upper side. That is, the terminal connecting portion 51 has a tapered shape in which the width thereof increases as it is closer to the upper side (the width thereof decreases as it is closer to the lower side) when viewed in side cross section. To be specific, the terminal connecting portion 51 has a generally circular shape when viewed from the bottom, and has a generally conic trapezoid shape in which the diameter thereof increases as it is closer to the upper side (the diameter thereof decreases as it is closer to the lower side). As referred to a phantom line of FIG. 3A, the terminal connecting portion 51 integrally includes a peripheral end portion 53 and a solid portion 54 that is disposed at the inner side thereof.

The peripheral end portion 53 is in contact with the inner side surface 43 that forms the imaging element opening portion 41 in the base insulating layer 4, and forms the outer shape of the terminal connecting portion 51 in the plane direction. That is, the peripheral end portion 53 has a hollow generally conic trapezoid shape.

The solid portion 54 is integrally formed with the peripheral end portion 53 at the inner side of the peripheral end portion 53. That is, the outer peripheral end of the solid portion 54 is continuous to the inner peripheral end of the peripheral end portion 53. The solid portion 54 has a solid generally conic trapezoid shape.

As shown in FIG. 2, the peripheral end portion 53 and the solid portion 54 fill (satisfy) the entire imaging element opening portion 41. That is, the shape of the terminal connecting portion 51 that consists of the peripheral end portion 53 and the solid portion 54 matches that of the imaging element opening portion 41, and the thickness thereof is the same as that of the base insulating layer 4.

The lower surface (exposed surface) of the terminal connecting portion 51 is exposed from the imaging element opening portion 41, and formed generally flat. To be specific, the lower surface of the terminal connecting portion 51 is generally flush with the lower surface of the base insulating layer 4. That is, between the lower surface of the terminal connecting portion 51 and the lower surface of the base insulating layer 4, a deviation (difference in level) in the up-down direction does not completely occur, or the difference in level therebetween in the up-down direction is, for example, 2.0 μm or less, preferably 1.0 μm or less, more preferably 0.5 μm or less.

The wire connecting portion 52 is a portion continuous to the connecting wire 12 in the plane direction, and forms the upper portion of the imaging element connecting terminal 9.

The wire connecting portion 52 has a generally circular flat plate shape when viewed from the bottom, and includes the terminal connecting portion 51 when projected in the thickness direction. That is, the peripheral end edge of the wire connecting portion 52 is positioned at the outer side with respect to that of the terminal connecting portion 51 in the plane direction (the front-rear direction and the right-left direction). The lower surface of the inner peripheral portion of the wire connecting portion 52 is integrally continuous to the upper surface of the terminal connecting portion 51 in the up-down direction. The lower surface of the outer peripheral portion of the wire connecting portion 52 is in contact with the upper surface of the base insulating layer 4.

Figure 3A:
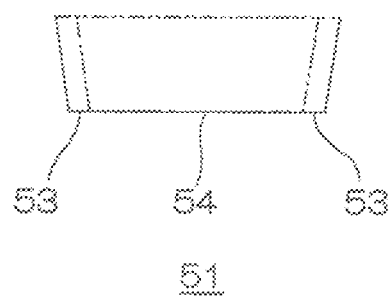
FIGS. 3A to 3B show cross-sectional views of only an imaging element connecting terminal of the imaging element-mounting board shown in FIG. 2.
Figure 3B:
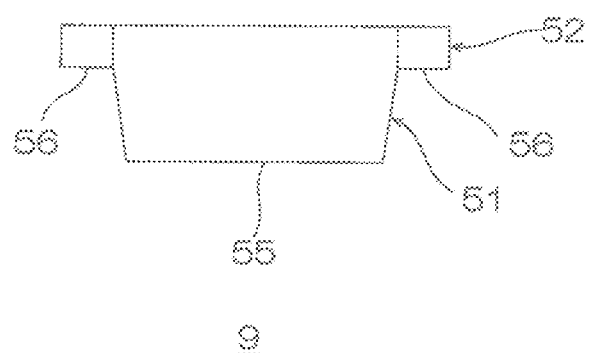

As referred to the phantom line of FIG. 3B, when projected in the up-down direction, the imaging element connecting terminal 9 integrally includes an inner side portion 55 that is included in the outermost shape of the imaging element opening portion 41 and an outer side portion 56 (brim portion) that extends from the inner side portion 55 outwardly. That is, in the imaging element connecting terminal 9, the terminal connecting portion 51 and the inner peripheral portion of the wire connecting portion 52 that is continuous thereto in the up-down direction correspond to the inner side portion 55. The peripheral end portion of the wire connecting portion 52 that is in contact with the upper surface of the base insulating layer 4 corresponds to the outer side portion 56.

The upper surface of the imaging element connecting terminal 9 (that is, the upper surface of the wire connecting portion 52) is formed generally flat. To be specific, the upper surface of the inner side portion 55 is generally flush with the upper surface of the outer side portion 56. That is, between the upper surface of the inner side portion 55 and the upper surface of the outer side portion 56, a deviation (difference in level) in the up-down direction does not completely occur, or the difference in level therebetween in the up-down direction is, for example, 2.0 μm or less, preferably 1.0 μm or less, more preferably 0.5 μm or less.

A region that is, when the mounting board 1 is projected in the thickness direction, overlapped with the imaging element connecting terminal 9 when viewed from the top or the bottom is defined as a terminal region 14.

As shown in FIG. 1, the plurality of external component connecting terminals 10 are disposed in alignment at spaced intervals to each other in the right-left direction in the rear end edge of the external component connecting portion 3. That is, the plurality of external component connecting terminals 10 are provided so as to correspond to a plurality of terminals (not shown) of the external component. The plurality of external component connecting terminals 10 are provided corresponding to the plurality of external component opening portions 42. Each of the plurality of external component connecting terminals 10 has a generally rectangular shape (rectangle-shaped) when viewed from the top. The external component connecting terminal 10 is disposed at the inside of the external component opening portion 42, and the lower surface thereof is exposed from the external component opening portion 42.

As shown in FIG. 2, the plurality of wires 11 include a plurality of connecting wires 12 and a plurality of ground wires 13.

The plurality of connecting wires 12 are provided so as to correspond to the plurality of imaging element connecting terminals 9 and the plurality of external component connecting terminals 10. To be specific, the connecting wire 12 is integrally formed with the imaging element connecting terminal 9 and the external component connecting terminal 10 so as to connect the imaging element connecting terminal 9 to the external component connecting terminal 10. That is, one end of the connecting wire 12 is continuous to the wire connecting portion 52 of the imaging element connecting terminal 9 in the plane direction, and the other end thereof is continuous to the external component connecting terminal 10 in the plane direction, so that the wire connecting portion 52 is electrically connected to the external component connecting terminal 10.

The upper surface of the connecting wire 12 is formed so as to be generally flush with the upper surface of the wire connecting portion 52. That is, between the upper surface of the connecting wire 12 and the upper surface of the wire connecting portion 52, a deviation (difference in level) in the up-down direction does not completely occur, or the difference in level therebetween in the up-down direction is, for example, 2.0 μm or less, preferably 1.0 μm or less, more preferably 0.5 μm or less.

The plurality of ground wires 13 are provided so as to correspond to the plurality of connecting wires 12. To be specific, the plurality of ground wires 13 are provided along the plurality of connecting wires 12. The upper surface of the ground wire 13 is at the same position in the up-down direction as the upper surface of the connecting wire 12, and the lower surface thereof is at the same position in the up-down direction as the lower surface of the connecting wire 12. A ground terminal that is not shown is integrally connected to one end of the ground wire 13.

Examples of a material for the conductive pattern 5 (the imaging element connecting terminal 9, the external component connecting terminal 10, the wire 11) include metal materials such as copper silver, gold, and nickel, and an alloy thereof, and solder. Preferably, copper is used.

The imaging element connecting terminal 9 (the terminal connecting portion 51 and the wire connecting portion 52) and the external component connecting terminal 10 have a thickness $T_2$ of, for example, 2 μm or more, preferably 5 μm or more, more preferably 7 μm or more, and for example, 30 μm or less, preferably 20 μm or less, more preferably 15 μm or less. By setting the thickness $T_2$ to the above-described upper limit or less, a reduction in thickness of the mounted board 1 can be achieved. That is, the mounting board 1 can suppress the damage of the terminal, while capable of achieving a reduction in thickness.

The wire 11 has a thickness $T_3$ of, for example, 1 μm or more, preferably 3 μm or more, and for example, 15 μm or less, preferably 10 μm or less, more preferably 8 μm or less, further more preferably 5 μm or less.

A width the imaging element connecting terminal 9, that is, a length L (diameter) in the plane direction of the terminal region 14 is, for example, 30 μm or more, preferably 50 μm or more, and for example, 500 μm or less, preferably 200 μm or less.

The wire 11 has a width of, for example, 5 μm or more, preferably 10 μm or more, and for example, 100 μm or less, preferably 50 μm or less.

The first cover insulating layer 6 is provided at the upper side of the base insulating layer 4 and the conductive pattern 5 so as to cover the conductive pattern 5. That is, the first cover insulating layer 6 is disposed so as to be in contact with the upper surface and the side surfaces of the conductive pattern 5, and a portion that is exposed from the conductive pattern 5 on the upper surface of the base insulating layer 4. The position in the up-down direction of the lower surface of the first cover insulating layer 6 matches that in the up-down direction of the lower surface of the wire 11, and that in the up-down direction of the upper surface of the base insulating layer 4. The outer shape when viewed from the top of the first cover insulating layer 6 is formed so as to be the same as the base insulating layer 4 except for a forming portion of the external component connecting terminal 10.

The first cover insulating layer 6 has a ground opening portion 61. The ground opening portion 61 is an opening portion for exposing the upper surface of the ground wire 13. The ground opening portion 61 is formed so as to be overlapped with the ground wire 13 when projected in the thickness direction. The ground opening portion 61 has a generally circular shape when viewed from the bottom passing through the first cover insulating layer 6 in the thickness direction. The ground opening portion 61 has a tapered shape in which the width thereof decreases as it is closer to the lower side when viewed in side cross section.

The first cover insulating layer 6 is formed from the same insulating material as that of the base insulating layer 4 described above. Preferably, the first cover insulating layer 6 is formed from the polyimide resin.

The first cover insulating layer 6 has a thickness $T_4$ of, for example, 1 μm or more, preferably 2 μm or more, and for example, 30 μm or less, preferably 10 μm or less, more preferably 5 μm or less.

A shield layer 7 is disposed at the upper side of the first cover insulating layer 6 so as to be in contact with the upper surface of the first cover insulating layer 6. The shield layer 7 is a layer that shields electromagnetic waves from the outside, and has a sheet shape extending in the plane direction (the front-rear direction and the right-left direction).

The shield layer 7 is electrically connected to the ground wire 13. That is, the shield layer 7 is continuous to the ground wire 13 in the ground opening portion 61. To be specific, the shield layer 7 has a protruding shape downwardly in a portion that faces the ground wire 13, and includes a contact portion 71 that is in contact with the upper surface of the ground wire 13.

The contact portion 71 includes a flat portion 72 that is in direct contact with the ground wire 13, and an inclined portion 73 that is integrally disposed so as to be continuous to the periphery of the flat portion 72.

The flat portion 72 has a flat plate shape extending in the plane direction.

The inclined portion 73 extends in an inclination direction that crosses (inclines) in the up-down direction and the plane direction.

When viewed in side cross section, an angle made between the flat portion 72 and the inclined portion 73 is, for example, 100° or more, preferably 120° or more, and for example, 170° or less, preferably 160° or less. In this manner, the shield layer 40 that can be grounded to the ground wire 13 without disconnection can be formed by a method such as sputtering, so that a reduction in thickness of the shield layer 40 can be achieved.

In this manner, the shield layer 7 is grounded via the ground wire 13.

The shield layer 7 is made of a conductor, and metal materials such as copper, chromium, nickel, gold, silver, platinum, palladium, titanium, tantalum, and solder, and an alloy thereof are used. Preferably, copper is used.

The shield layer 7 has a thickness $T_5$ of, for example, 0.05 μm or more, preferably 0.1 μm or more, and for example, 3 μm or less, preferably 1 μm or less.

The second cover insulating layer 8 is provided at the upper side of the shield layer 7 so as to cover the entire surface of the shield layer 7. The outer shape of the second cover insulating layer 8 is formed so as to be the same as that of the first cover insulating layer 6.

The second cover insulating layer 8 has a thickness $T_6$ of, for example, 1 μm or more, preferably 2 μm or more, and for example, 30 μm or less, preferably 10 μm or less, more preferably 5 μm or less.

The mounting board 1 (in particular, the mounting board 1 in the terminal region 14) has a total thickness $T_7$ of, for example, 7 μm or more, preferably 10 μm or more, and for example, 50 μm or less, preferably 30 μm or less.

In the mounting board 1, an upper surface 14a of the terminal region 14 is formed so that the entire surface thereof is formed generally flat. To be specific, a deviation in the up-down direction of the upper surface 14a of the terminal region 14 with respect to a line connecting both ends (points A and B of FIG. 2) of the upper surface 14a of the terminal region 14 is, for example, 3.0 μm or less, preferably 2.0 μm or less, more preferably 1.0 μm or less, furthermore preferably 0.5 μm or less. In particular, a distance in the up-down direction between the line connecting both ends (points A and B of FIG. 2) of the upper surface 14a of the terminal region 14 and the lower surface (point C) of the center in the plane direction of the solid portion 54 is, for example, 3.0 μm or less, preferably 2.0 μm or less, more preferably 1.0 μm or less, furthermore preferably 0.5 μm or less.

An amount of change of the total thickness of the mounting board 1 in the terminal region 14 is, for example, 3.0 μm or less, preferably 2.0 μm or less, more preferably 1.0 μm or less, furthermore preferably 0.5 μm or less. The amount of change is based on the thickness of the end edges (points A and B of FIG. 2) in the plane direction of the terminal region 14. A difference of the thickness between both end edges and the central point (point C of FIG. 2) in the plane direction thereof is within the above-described range.

2. Method for Producing Imaging Element-Mounting Board

As shown in FIGS. 4A to 5G, the mounting board 1 of the first embodiment is, for example, obtained by sequentially carrying out a metal supporting plate preparing step, a base insulating layer forming step, a metal thin film forming step, a photo resist forming step, a conductive pattern forming step, a photo resist and metal thin film removing step, a first cover insulating layer forming step, a shield layer forming step, a second cover insulating layer forming step, and a metal supporting plate removing step.

As shown in FIG. 4A, in the metal supporting plate preparing step, a metal supporting plate 16 is prepared.

The metal supporting plate 16 is, for example, formed from a metal material such as stainless steel, 42-alloy, aluminum, and copper alloy. Preferably, the metal supporting plate 16 is formed from stainless steel.

The metal supporting plate 16 has a thickness of, for example, 5 μm or more, preferably 10 μm or more, and for example, 50 μm or less, preferably 30 μm or less.

The upper surface of the metal supporting plate 16 is formed flat (smooth).

As shown in FIG. 4B, in the base insulating layer forming step, the base insulating layer 4 is formed on the upper surface of the metal supporting plate 16. That is, the base insulating layer 4 having the opening portions (the imaging element opening portion 41 and the external component opening portion 42) is formed on the upper surface of the metal supporting plate 16.

To be specific, a varnish of a photosensitive insulating material (for example, photosensitive polyimide) is applied to the entire upper surface of the metal supporting plate 16 to be dried, so that a base film (base insulating layer) is formed. Thereafter, the base film is exposed to light via a photomask having a pattern corresponding to the opening portions (the imaging element opening portion 41 and the external component opening portion 42). The tapered shape can be formed by adjusting parallelism of light by an exposure gap or the like at the time of exposure to light. Thereafter, the base film is developed, and cured by heating as needed.

As shown in FIG. 4C, in the metal thin film forming step, the metal thin film 17 (seed film) is formed on the upper surface of the base insulating layer 4, and a portion that is exposed from the imaging element opening portion 41 and the external component opening portion 42 on the upper surface of the metal supporting plate 16.

Examples of the metal thin film 17 include metal materials such as copper, chromium, nickel, and titanium, and an alloy thereof. Preferably, in view of adhesive properties to the base insulating layer 4, chromium is used.

The metal thin film 17 is, for example, formed by carrying out a thin film forming method such as sputtering and plating with respect to the base insulating layer 4 that is formed on the metal supporting plate 16. Preferably, in view of adhesive properties, the metal thin film 17 (sputtering film) is formed by sputtering.

The metal thin film 17 has a thickness of, for example, 10 nm or more, preferably 20 nm or more, and for example, 300 nm or less, preferably 150 nm or less.

As shown in FIG. 4D, in the photo resist forming step, a photo resist 18 is formed on the metal thin film 17. That is, the photo resist 18 having an opening portion corresponding to the conductive pattern 5 is formed.

To be specific, a dry film resist is disposed on the entire upper surface of the metal thin film 17. Thereafter, the dry film resist is exposed to light via the photomask having a pattern corresponding to the conductive pattern 5. Thereafter, the dry film resist is developed, and cured by heating as needed, so that the photo resist 18 is formed as a plating resist.

In this manner, the metal thin film 17 in a portion corresponding to the conductive pattern 5 is exposed from the photo resist 18.

As shown in FIG. 4E, in the conductive pattern forming step, the conductive pattern 5 is formed in a portion that is exposed from the photo resist 18 on the surface of the metal thin film 17.

To be specific, for example, electrolytic plating in which electricity is supplied from the metal thin film 17 is carried out.

At this time, a via-fill plating method is used. To be specific, for example, plating bath (preferably, copper sulfate plating bath) containing a retardant that suppresses the plating growth and an accelerator that promotes the plating growth is used.

In this manner, while the growth of a plating layer 19 from the metal thin film 17 (the metal thin film 17 that grows into the wire 11) that is positioned on the upper surface of the base insulating layer 4 is suppressed, the growth of the plating layer 19 of the metal thin film 17 (the metal thin film 17 that grows into the imaging element connecting terminal 9) that is positioned at the inside of the imaging element opening portion 41 is promoted. Thus, the plating layer 19 is formed so as to fill the entire imaging element opening portion 41. That is, in the imaging element opening portion 41, the terminal connecting portion 51 that integrally includes the peripheral end portion 53 and the solid portion 54 is formed, and furthermore, the wire connecting portion 52 is integrally formed at the upper portion thereof. The upper surface of the wire connecting portion 52 is formed so as to be flush with the upper surface of the wire 11. As a result, the conductive pattern 5 having the imaging element connecting terminal 9, the external component connecting terminal 10, and the wire 11 is formed.

The metal thin film 17 corresponding to the conductive pattern 5 is unified with the plating layer 19 by the electrolytic plating, thereby forming the conductive pattern 5 along with the plating layer 19. That is, in FIGS. 4D to 5H, each of the imaging element connecting terminal 9 and the wire 11 is illustrated to be two layers of the plating layer 19 and the metal thin film 17. Alternatively, when the material for the plating layer 19 is the same as that for the metal thin film 17, the plating layer 19 and the metal thin film 17 may be completely unified to be one layer (ref: FIG. 2).

As shown in FIG. 5F, in the photo resist and metal thin film removing step, the photo resist 18 and the metal thin film 17 are removed.

To be specific, first, the remaining photo resist 18 is removed. For example, the photo resist 18 is removed by wet etching. Thereafter, the metal thin film 17 that faces the remaining photo resist 18 is removed. For example, the metal thin film 17 is removed by peeling or the wet etching.

As shown in FIG. 5G, in the first cover insulating layer forming step, the first cover insulating layer 6 is disposed on the upper surfaces of the conductive pattern 5 and five base insulating layer 4.

At this time, the first cover insulating layer 6 having the ground opening portion 61 is formed so as to expose the upper surface of the ground wire 13 of the conductive pattern 5. The first cover insulating layer 6 is formed so that the ground opening portion 61 has a tapered shape in which the width thereof decreases as it is closer to the lower side when viewed in side cross section.

To be specific, for example, the first cover insulating layer forming step is carried out in the same manner as that of the base insulating layer forming step.

As shown in FIG. 5H, in the shield layer forming step, the shield layer 7 is formed on the first cover insulating layer 6.

In the forming of the shield layer 7, for example, a plating method such as electrolytic plating and electroless plating, a sputtering method, an evaporation method, an ion plating method, and an application method by a conductive paste are used. Preferably, in view of reduction in thickness, a sputtering method and an evaporation method are used, more preferably, a sputtering method is used.

As shown in FIG. 5I, in the second cover insulating layer forming step, the second cover insulating layer 8 is disposed on the upper surface of the shield layer 7.

To be specific, the second cover insulating layer 8 is formed on the entire upper surface of the shield layer 7.

To be specific, the second cover insulating layer forming step is carried out in the same manner as that of the base insulating layer forming step.

In this manner, the mounting board 1 including the base insulating layer 4, the conductive pattern 5, the first cover insulating layer 6, the shield layer 7, and the second cover insulating layer 8 is obtained in a state of being supported by the metal supporting plate 16.

As shown in FIG. 5J, in the metal supporting plate removing step, the metal supporting plate 16 is removed.

Examples of a removing method include a method of removing the metal supporting plate 16 from the lower surface of the mounting board 1 and a method of processing the metal supporting plate 16 by the wet etching.

In this manner, the mounting board 1 including the base insulating layer 4, the conductive pattern 5, the first cover insulating layer 6, the shield layer 7, and the second cover insulating layer 8 is obtained.

The mounting board 1 is, for example, used in a wiring circuit board for mounting the imaging element. That is, the mounting board 1 is used in an imaging device such as camera module.

3. Imaging Device

An imaging device 20 including the mounting board 1 of the first embodiment is described with reference to FIG. 6.

The imaging device 20 includes the mounting board 1, the imaging element 21, the housing 22, an optical lens 23, and a filter 24.

The mounting board 1 in a state of FIG. 2 is reversed upside down to be used. That is, the mounting board 1 is disposed so that the base insulating layer 4 is the upper side and the second cover insulating layer 8 is the lower side.

The imaging element 21 is a semiconductor element that converts light to electrical signals, and examples thereof include solid imaging elements such as CMOS sensor and CCD sensor.

The imaging element 21 has a generally rectangular flat plate shape when viewed from the top, and though not shown, includes a silicon such as Si board, and a photo diode (photoelectric converting element) and a color filter that are disposed thereon. The plurality of terminals 25 corresponding to the imaging element connecting terminal 9 of the mounting board 1 are provided on the lower surface of the imaging element 21.

The imaging element 21 has a thickness of, for example, 10 μm or more, preferably 50 μm or more, and for example, 1000 μm or less, preferably 500 μm or less.

The imaging element 21 is mounted on the mounting board 1. That is, the terminal 25 of the imaging element 21 is flip-chip mounted on the corresponding imaging element connecting terminal 9 of the mounting board 1 via the solder bump 26 or the like. In this manner, the imaging element 21 is disposed in the central portion of the housing disposed portion 2 of the mounting board 1 to be electrically connected to the imaging element connecting terminal 9 and the external component connecting terminal 10 of the mounting board 1.

The imaging element 21 is mounted on the mounting board 1 to constitute an imaging unit 27. That is, the imaging unit 27 includes the mounting board 1 and the imaging element 21 that is mounted thereon.

The housing 22 is disposed in the housing disposed portion 2 of the mounting board 1 at spaced intervals to the imaging element 21 so as to surround it. The housing 22 has a generally rectangular cylindrical shape when viewed from the top. In the upper end of the housing 22, a fixing portion for fixing the optical lens 23 is provided.

The optical lens 23 is disposed at the upper side of the mounting board 1 at spaced intervals to the mounting board 1 and the imaging element 21. The optical lens 23 has a generally circular shape when viewed from the top, and is fixed by the fixing portion so that light from the outside reaches the imaging element 21.

The filter 24 is disposed in the center in the up-down direction of the imaging element 21 and the optical lens 23 at spaced intervals thereto, and fixed to the housing 22.

The mounting board 1 includes the base insulating layer 4, the imaging element connecting terminal 9, the first cover insulating layer 6, and the connecting wire 12. The base insulating layer 4 has the imaging element opening portion 41 passing through the base insulating layer 4 in the up-down direction and having a shape in which the opening cross-sectional area increases as it is closer to the upper side. The imaging element connecting terminal 9 has the peripheral end portion 53 that is in contact with the inner side surface 43 of lire imaging element opening portion 41 and the solid portion 54 that is integrally disposed with the peripheral end portion 53 at the inner side of the peripheral end portion 53. The peripheral end portion 53 and the solid portion 54 fill the entire imaging element opening portion 41.

Figure 7:
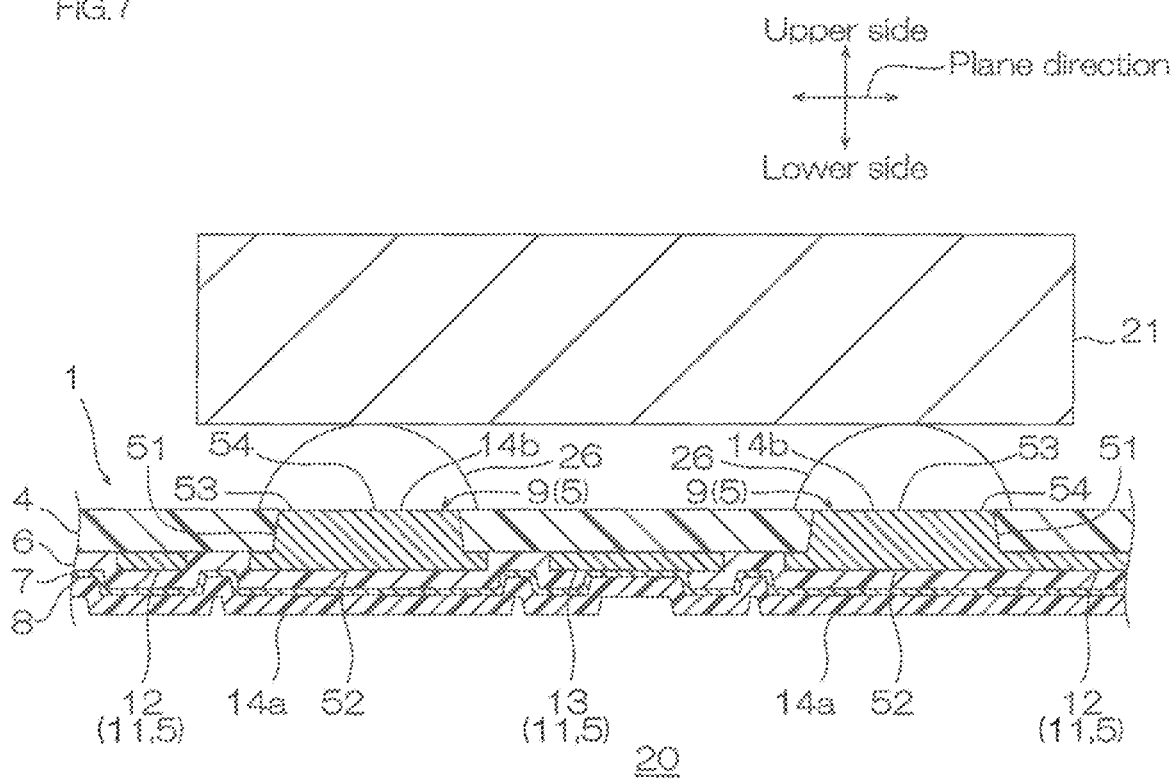
FIG. 7 shows a schematic diagram at the time of mounting an imaging element on the imaging element-mounting board shown in FIG. 1.

Thus, the terminal region 14 on which the imaging element 21 is mounted is reinforced by the solid portion 54. Accordingly, when the mounting board 1 is reversed upside down and the imaging element 21 is mounted on the mounting board 1 from above, the deformation of the terminal region 14 of the mounting board 1 downwardly can be suppressed (ref: FIG. 7). As a result, an inclination of the imaging element 21 with respect to the mounting board 1 can be suppressed, and the imaging element 21 can be accurately mounted. Also, a supporting board such as the metal supporting plate 16 is not required, so that a reduction in thickness is possible.

Figure 8A:
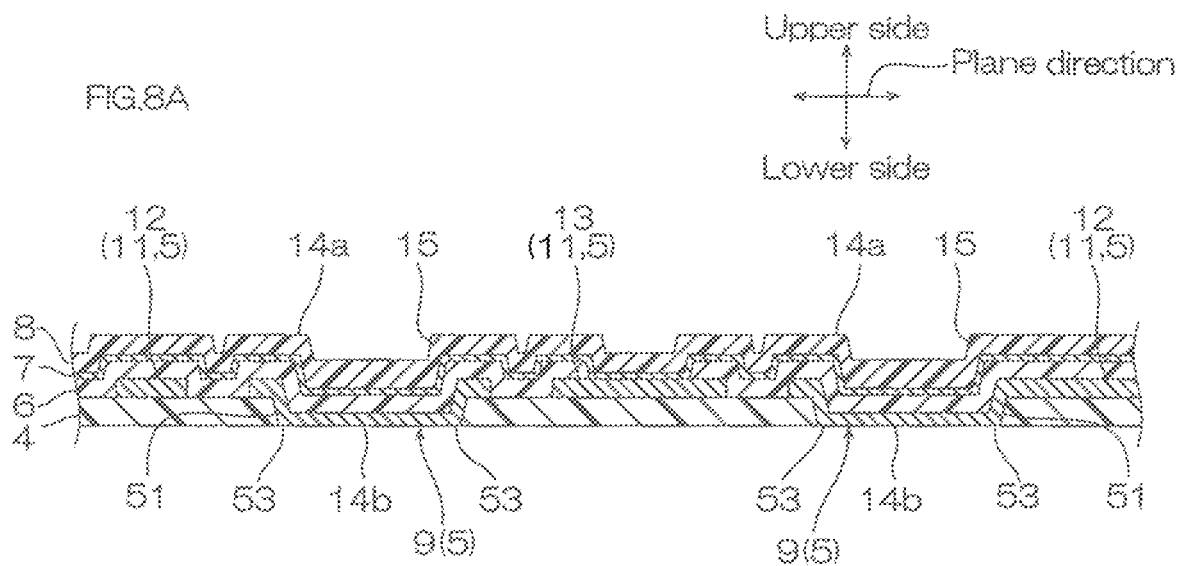
FIGS. 8A to 8B show schematic diagrams at the time of mounting an imaging element on an imaging element-mounting board in which a solid portion does not fill an imaging element opening portion.
Figure 8B:
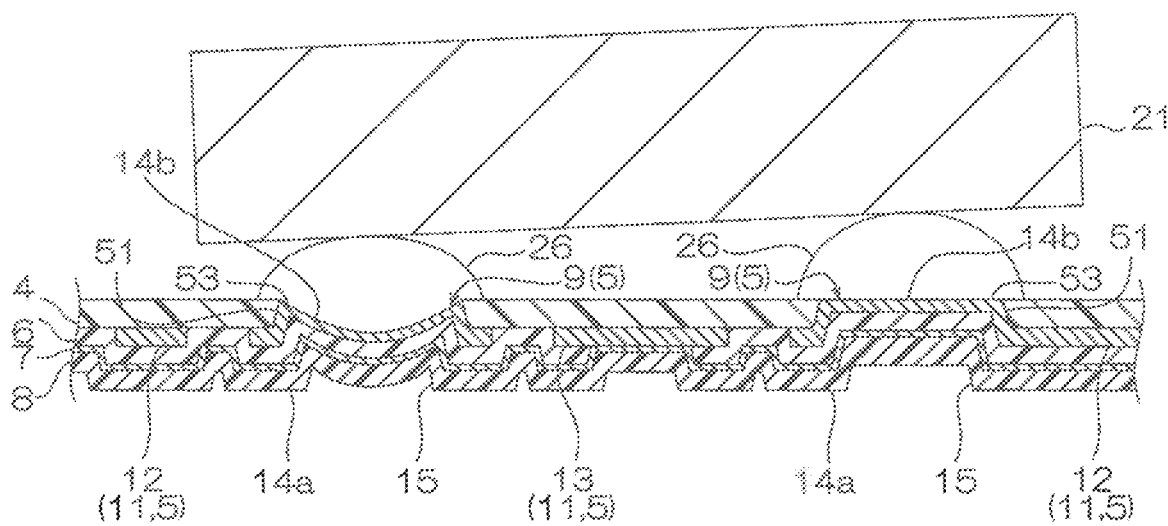

Also, for example, as shown in FIG. 8A, in a mounting board that includes the peripheral end portion 53 and does not include the solid portion 54, to be more specific, in a mounting board that does not include the solid portion 54 and in which the peripheral end portion 53 is continuous so as to seal the imaging element opening portion 41 in the lower end portion, a recessed portion 15 is formed on the upper surface 14a of the terminal region 14. As shown in FIG. 8B, when the mounting board is reversed upside down and the imaging element 21 is mounted on the mounting board from above, the terminal region 14 is partially deformed downwardly by the stress downwardly at the time of the mounting and the presence of the recessed portion 15. As a result, the imaging element 21 is inclined, and the mounting accuracy is reduced.

Figure 9A:
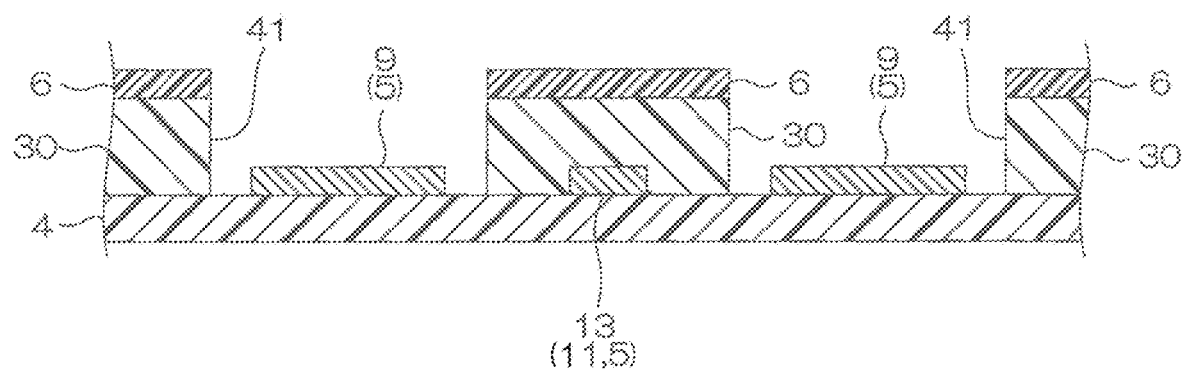
FIGS. 9A to 9B show schematic diagrams at the time of mounting an imaging element on a cover lay adhesive-type imaging element-mounting board.
Figure 9B:
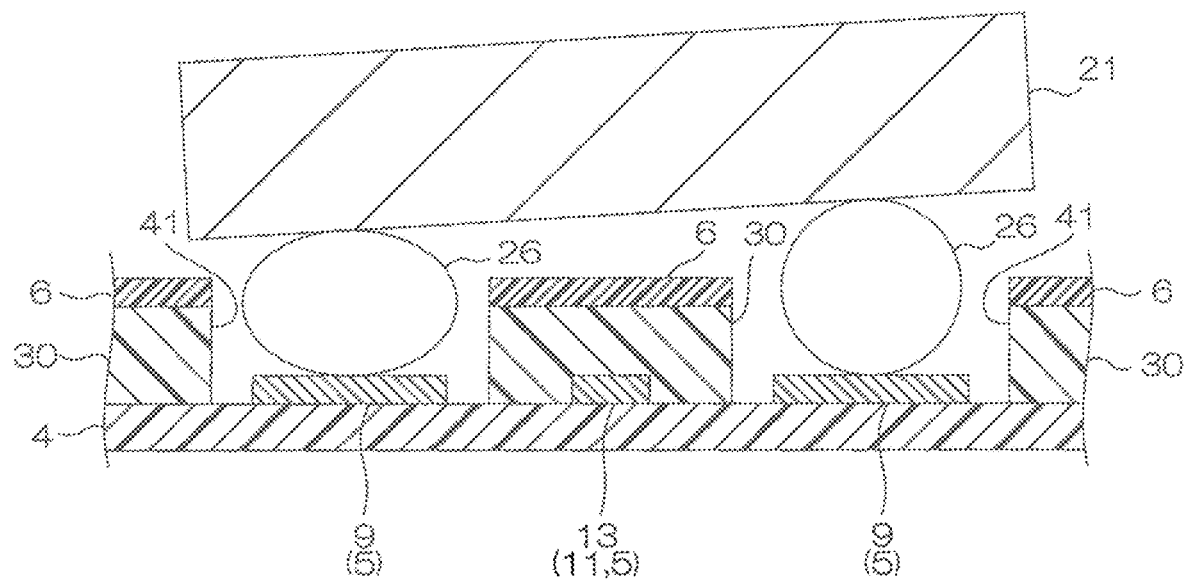

As shown in FIG. 9A, in a conventional cover lay adhesive-type mounting board, that is, in a mounting board having the base insulating layer 4, the conductive pattern 5, an adhesive layer 30, and the first cover insulating layer 6, the imaging element connecting terminal 9 is disposed at the inside of the imaging element opening portion 41, and positioned at the lower side with respect to the upper surface of the first cover insulating layer 6. As shown in FIG. 9B, when the imaging element 21 is mounted on the mounting board, the solder bump 26 is disposed at the inside of the imaging element opening portion 41, so that the volume (amount) of the solder bump 26 is required to be increased, and thus, the dispersion in the shape and the size of each of the solder bumps 26 is increased. As a result, there may be a case where the imaging element 21 is inclined and the mounting accuracy is reduced.

In FIGS. 7 to 9B, to clearly show the function and effect, the size of the imaging element 21, and the number and the size of each of the terminals are changed.

The imaging element opening portion 41 has a shape in which the opening cross-sectional area increases as it is closer to the upper side, and the imaging element connecting terminal 9 fills the imaging element opening portion 41. Thus, the imaging element connecting terminal 9 has a wide shape in which the cross-sectional area increases as it is closer to the upper side, and has a sufficient thickness. Thus, when the mounting board 1 is reversed upside down, and the imaging element 21 is mounted on the mounting board 1 from above, the imaging element connecting terminal 9 can receive a stress from above downwardly, while dispersing the stress more at the terminal's lower side portions (ref: FIG. 7). Thus, the damage of the imaging element connecting terminal 9 can be suppressed.

As shown in FIG. 2, the imaging element opening portion 41 has the opening area increasing as being closer to the upper side. That is, the imaging element opening portion 41 has the opening area decreasing as being closer to the lower side. Thus, the area (exposed area) of the terminal connecting portion 51 that is exposed from the imaging element opening portion 41 can be reduced. Accordingly, when the plurality of imaging element connecting terminals 9 are formed, a difference of dispersion of the absolute value of the exposed area between the imaging element connecting terminals 9 can be reduced. As a result, the dispersion of the electrical conductivity caused by the dispersion of the contact area of the imaging element 21 with the terminal 25 can be reduced.

As shown in FIG. 2, in the mounting board 1, the tower surface of the imaging element connecting terminal 9, that is, the lower surface of the terminal connecting portion 51 is generally flush with the lower surface of the base insulating layer 4. Thus, as shown in FIG. 7, when the mounting board 1 is reversed upside down and the imaging element 21 is mounted on the mounting board 1 from above, the collision of the imaging element 21 and the solder bump 26 with the base insulating layer 4 around a lower surface 14b (upper side at the time of the mounting) of the terminal region 14 can be suppressed. Accordingly, the imaging element 21 can be easily mounted on the mounting board 1.

As shown in FIG. 2, in the mounting board 1, the upper surface 14a of the terminal region 14 is generally flat. Thus, as shown in FIG. 7, the entire upper surface 14a (corresponding to the lower surface in FIG. 7) of the terminal region 14 can be easily brought into contact with a placing table (not shown) at the time of the mounting, and the terminal region 14 can be supported by the upper surface 14a. As a result, the deformation at the inside of the terminal region 14 in the up-down direction can be furthermore surely suppressed.

On the upper surface of the mounting board 1, an external region recessed portion (a code 80 shown in FIG. 2) as a region other than the terminal region 14 is present between the plurality of terminal regions 14. In particular, it is important that the upper surface 14a of the terminal region 14 is generally flat. This is because as shown in FIG. 7, at the time of mounting the imaging element 21, a region to which a pressure from the imaging element 21 is applied is substantially only the terminal region 14. That is, the pressure is seldom applied to the external region recessed portion 80, so that even when the external region recessed portion 80 is present, it is considered that there is substantially no effect of the deformation in the up-down direction of the terminal region 14 of the mounting board 1, accordingly, the entire mounting board 1.

As shown in FIG. 2, in the mounting board 1, the imaging element connecting terminal 9 includes the wire connecting portion 52 that is integrally disposed with the peripheral end portion 53 and the solid portion 54 at the upper side of the peripheral end portion 53 and the solid portion 54. The mounting board 1 includes the connecting wire 12, and the upper surface of the connecting wire 12 is generally flush with the upper surface of the wire connecting portion 52.

Thus, the terminal region 14 can be furthermore reinforced by the wire connecting portion 52. Thus, the deformation of the terminal region 14 in the up-down direction can be furthermore suppressed. Also, the upper surfaces of the connecting wire 12 and the wire connecting portion 52 are generally flush with each other, so that the upper surface (a region corresponding to the connecting wire 12 and a region corresponding to the wire connecting portion 52) of the mounting board 1 can be furthermore formed flat. Thus, the deformation of the entire mounting board 1 in the up-down direction can be furthermore suppressed.

When projected in the up-down direction, in the mounting board 1, the imaging element connecting terminal 9 includes the inner side portion 55 and the outer side portion 56. The upper surface of the inner side portion 55 is generally flush with the upper surface of the outer side portion 56.

Thus, the upper surface 14a of the terminal region 14 can be furthermore formed flat. Accordingly, the deformation at the inside of the terminal region 14 in the up-down direction can be furthermore suppressed.

The mounting board 1 further includes the shield layer 7 that is disposed on the upper surface of the first cover insulating layer 6 and the second cover insulating layer 8 that is disposed on the upper surface of the shield layer 7. Thus, the electromagnetic waves generated from the outside can be shielded by the shield layer 7, so that the reliability of the imaging device 20 can be improved.

The wire 11 includes the connecting wire 12 and the ground wire 13, and the shield layer 7 is electrically connected to the ground wire 13. Thus, the ground wire 13 is disposed on the upper surface of the base insulating layer 4, that is, on the same position in the up-down direction as the connecting wire 12. Thus, there is no need for separately providing a layer for providing the ground wire 13. As a result a reduction in thickness of the mounting board 1 can be achieved.

Also, the mounting board 1 is an adhesive-less mounting board in which each of the layers (the base insulating layer 4, the conductive pattern 5, the first cover insulating layer 6, the shield layer 7, and the second cover insulating layer 8) is in direct contact with each other. Thus, a reduction in thickness (reduction in height) can be achieved. Along with this, the adhesive layer 30 such as acrylic adhesive is not required, so that the deterioration of the adhesive layer 30 by wet heat can be suppressed, and excellent wet heat resistance can be achieved.

According to the method for producing the mounting board 1, the mounting board 1 having excellent mounting accuracy can be produced.

The method for producing the mounting board 1 includes the metal supporting plate preparing step, the base insulating layer forming step, the metal thin film forming step, the photo resist forming step, the conductive pattern forming step, the photo resist and metal thin film removing step, the first cover insulating layer forming step, the shield layer forming step, the second cover insulating layer forming step, and the metal supporting plate removing step.

Thus, the mounting board 1 is produced on the hard metal supporting plate 16, so that its handling is easy. When the thickness of the base insulating layer 4 is thin, the metal supporting plate 16 supports the base insulating layer 4, so that the wire 11 and the first cover insulating layer 6 can be surely disposed on the base insulating layer 4. As a result, a reduction in thickness of the base insulating layer 4, and accordingly, a reduction in thickness of the mounting board 1 can be achieved.

When the base insulating layer 4, the first cover insulating layer 6, and the second cover insulating layer 8 are formed by using a photosensitive insulating material, the adhesive layer 30 is not required between gaps of the base insulating layer 4, the conductive pattern 5, the first cover insulating layer 6, the shield layer 7, and the second cover insulating layer 8 and the layers can be laminated. Thus, the improvement of the heal resistance, and a reduction in thickness can be furthermore achieved.

According to the imaging device 20, the deformation of the terminal region 14 of the mounting board 1 downwardly is suppressed. Thus, the imaging element 21 is accurately mounted on the mounting board 1, so that the connection reliability is excellent. Also, the supporting board such as the metal supporting plate 16 is not required, so that a reduction in thickness is possible.

4. Modified Example

A modified example of the mounting board 1 of the first embodiment is described with reference to FIGS. 10 to 11. In the modified example, the same reference numerals are provided for members corresponding to each of those in the above-described embodiment shown in FIG. 2, and their detailed description is omitted.

(1) In the embodiment shown in FIG. 2, the upper surface 14a of the terminal region 14 is formed so that the entire surface thereof is formed generally flat. Alternatively, for example, as shown in FIG. 10, a part of the upper surface 14a of the terminal region 14 may form a minor recessed portion 81 and may not be formed generally flat.

In this case, the upper surface of the inner side portion 55 is not generally flush with the upper surface of the outer side portion 56, and positioned at the lower side with respect to the upper surface of the outer side portion 56. The depth of the minor recessed portion 81 is shallower than that of the external region recessed portion 80. That is, the bottom portion of the minor recessed portion 81 is positioned at the upper side with respect to that of the external region recessed portion 80.

Figure 10:
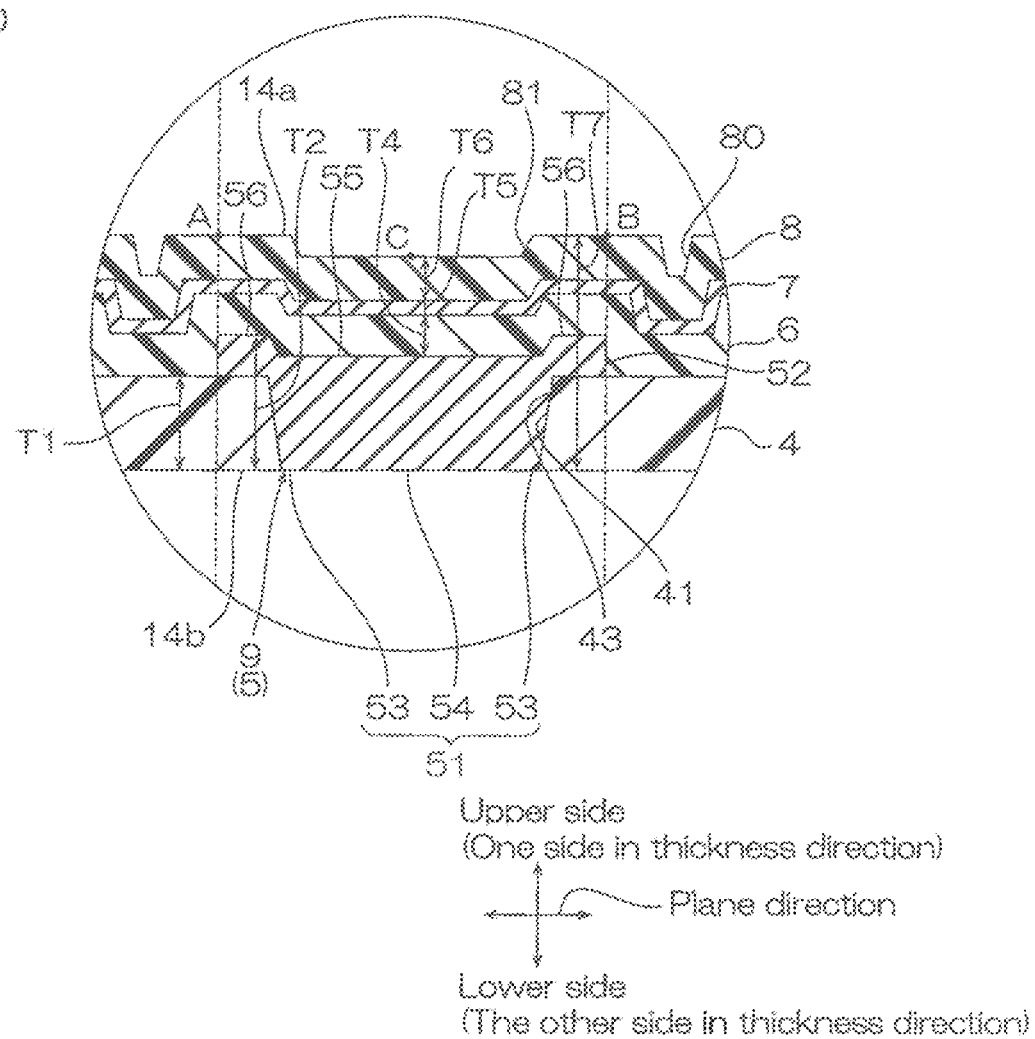
FIG. 10 shows a cross-sectional view of a modified example (embodiment in which a minor recessed portion is formed on the upper surface) of the first embodiment of the imaging element-mounting board of the present invention.

The embodiment shown in FIG. 10 can achieve the same function and effect as that of the embodiment shown in FIG. 2.

In view of furthermore surely capable of suppressing the deformation of the terminal region 14 of the mounting board 1, the embodiment shown in FIG. 2 is used.

(2) In the embodiment shown in FIG. 2, the mounting board 1 includes the base insulating layer 4, the conductive pattern 5, the first cover insulating layer 6, the shield layer 7, and the second cover insulating layer 8. Alternatively, for example, as shown in FIG. 11, the mounting board 1 may not include the shield layer 7 and the second cover insulating layer 8.

Figure 11:
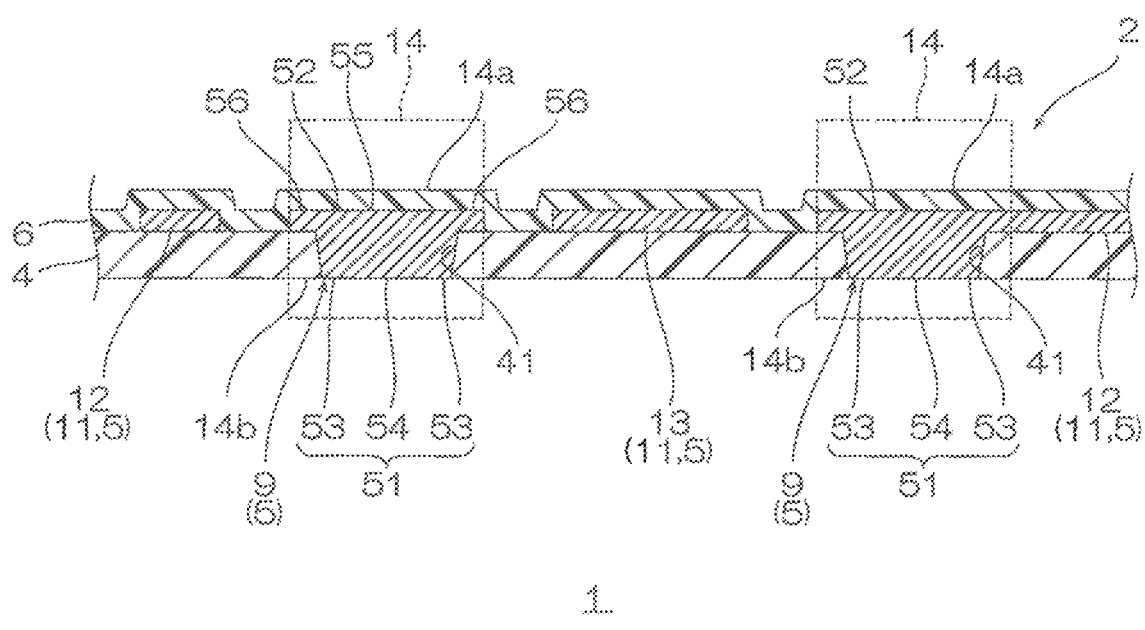
FIG. 11 shows a cross-sectional view of a modified example (embodiment in which a shield layer and a second cover insulating layer are not provided) of the first embodiment of the imaging element-mounting board of the present invention.

The mounting board 1 shown in FIG. 11 preferably consists of only the base insulating layer 4, the conductive pattern 5, and the first cover insulating layer 6. At this time, the first cover insulating layer 6 is disposed on the entire upper surface of the conductive pattern 5 and on the entire upper surface of the base insulating layer 4 that is exposed from the conductive pattern 5.

The embodiment shown in FIG. 11 can achieve the same function and effect as that of the embodiment shown in FIG. 2.

In view of capable of shielding the electromagnetic waves generated from the outside by the shield layer 7 and improving the reliability as the imaging device, preferably, the embodiment shewn in FIG. 2 is used.

(3) In the mounting board 1 shown in FIG. 2, the conductive pattern 5 (the imaging element connecting terminal 9, the external component connecting terminal 10, the wire 11) comprises one layer by unifying the material for the plating layer 19 with the material for the metal thin film 17. Alternatively, for example, as shown in FIG. 5J, the material for the plating layer 19 is different from the material for the metal thin film 17, and the conductive pattern 5 may have a two-layer structure of the plating layer 19 and the metal thin film 17. Preferably, the plating layer 19 is made of copper, and the metal thin film 17 is made of chromium. In this case, in the imaging element connecting terminal 9, the peripheral end portion 53 includes a chromium metal thin film that is disposed at the outer side in the plane direction and a copper metal portion that is disposed at the inner side thereof. The solid portion 54 includes a chromium metal thin film that is disposed at the lower side, and a copper metal portion that is disposed at the upper side thereof.

(4) In the embodiment shown in FIG. 2, the shield layer 17 is provided. Alternatively, for example, though not shown, the shield layer 17 may be a second conductive layer such as wire and terminal. The second conductive layer has a thickness of, for example, 1 µm or more, preferably 3 µm or more, and for example, 15 µm or less, preferably 10 µm or less, more preferably 8 µm or less, furthermore preferably 5 µm or less. The second conductive layer may not be electrically connected to the ground wire 13. The second conductive layer can be preferably formed by a plating method such as electrolytic plating.

(5) In the embodiment shown in FIG. 2, the wire 11 includes the ground wire 13. Alternatively, for example, though not shown, the wire 11 may not include the ground wire 13. That is, the wire 11 can consist of only the connecting wire 12.

(6) In the imaging device 20 including the mounting board 1 shown in FIG. 2, the imaging element 21 is flip-chip mounted on the mounting board 1. Alternatively, for example, though not shown, the imaging element 21 can be also mounted on the mounting board 1 by wire bonding.

Second Embodiment

1. Imaging Element-Mounting Board

Next, a second embodiment of the mounting board as one embodiment of a wiring circuit board of the present invention is described with reference to FIG. 12. In the mounting board 1 of the second embodiment, the same reference numerals are provided for members corresponding to each of those in the above-described first embodiment shown in FIG. 2, and their detailed description is omitted.

In the first embodiment, the imaging element connecting terminal 9 does not include a gold plating layer. As shown in FIG. 12, in the second embodiment, for example, the imaging element connecting terminal 9 includes a gold plating layer 57.

In the mounting board 1 of the second embodiment, the imaging element connecting terminal 9 includes the terminal connecting portion 51 and the wire connecting portion 52 that is disposed thereon.

The terminal connecting portion 51 includes the gold plating layer 57 and a filling portion 58 that is disposed at the upper side of the gold plating layer 57.

The gold plating layer 57 is disposed at the inside of the imaging element opening portion 41 and forms the lowermost portion of the terminal connecting portion 51. The lower surface (exposed surface) of the gold plating layer 57 is exposed from the imaging element opening portion 41 and is generally flush with the lower surface of the base insulating layer 4.

The gold plating layer 57 has a thickness of, (or example, 10 nm or more, preferably 20 nm or more, and for example, 500 nm or less, preferably 300 nm or less, more preferably 150 nm or less.

The filling portion 58 is provided at the upper side of the gold plating layer 57 so as to be in contact with the upper surface of the gold plating layer 57. The upper surface of the filling portion 58 is generally flush with the upper surface of the base insulating layer 4. That is, between the upper surface of the filling portion 58 and the upper surface of the base insulating layer 4, a deviation (difference in level) in the up-down direction does not completely occur, or the difference in level therebetween in the up-down direction is, for example, 2.0 μm or less, preferably 1.0 μm or less, more preferably 0.5 μm or less.

As a material for the filling portion 58, preferably, copper and nickel are used. When the material for the filling portion 58 is copper, the electrical conductivity of the imaging element connecting terminal 9 is excellent. When the material for the filling portion 58 is nickel, the hardness of the imaging element connecting terminal 9 is excellent, and the damage of the imaging element connecting terminal 9 can be furthermore suppressed.

The filling portion 58 has a thickness of, for example 1 μm or more, preferably 3 μm or more, and for example, 30 μm or less, preferably 10 μm or less.

The gold plating layer 57 and the filling portion 58 fill the entire imaging element opening portion 41.

Figure 13A:
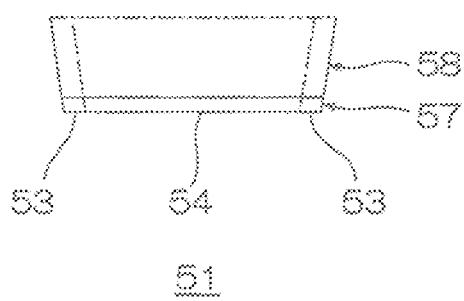
FIGS. 13A to 13B show cross-sectional views of only an imaging element connecting terminal of the imaging element-mounting board shown in FIG. 12.

As referred to the phantom line of FIG. 13A, in the second embodiment, the peripheral end portion 53 and the solid portion 54 that is disposed at the inner side thereof are provided in the terminal connecting portion 51, and the peripheral end portion 53 and the solid portion 54 fill the entire imaging element opening portion 41. To be specific, the peripheral end portion 53 and the solid portion 54 filling the imaging element opening portion 41 consist of the gold plating layer 57 and the filling portion 58. The peripheral end portion in the plane direction of the gold plating layer 57 and the peripheral end portion in the plane direction of the filling portion 58 correspond to the peripheral end portion 53 of the terminal connecting portion 51, and the inner side portion in the plane direction of the gold plating layer 57 and the inner side portion in the plane direction of the filling portion 58 correspond to the solid portion 54 of the terminal connecting portion 51.

The wire connecting portion 52 includes the metal thin film 17 and a wire connecting main body portion 59 that is disposed at the upper side thereof.

The metal thin film 17 is the above-described metal thin film 17 in the first embodiment.

The lower surface of the inner peripheral portion of the metal thin film 17 is continuous to the upper surface of the terminal connecting portion 51 (the filling portion 58) in the up-down direction, and the lower surface of the outer peripheral portion of the metal thin film 17 is in contact with the upper surface of the base insulating layer 4.

The wire connecting main body portion 59 matches the metal thin film 17 when projected in the thickness direction.

The wire connecting main body portion 59 has a thickness of, for example, 1 μm or more, preferably 3 μm or more, and for example, 15 μm or less, preferably 10 μm or less, more preferably 8 μm or less.

An example of a material for the wire connecting main body portion 59 includes the material for the conductive pattern 5. Preferably, in view of electrical conductivity, copper is used.

The imaging element connecting terminal 9 sequentially includes the gold plating layer 57, the filling portion 58, the metal thin film 17, and the wire connecting main body portion 59 from the bottom upwardly.

Figure 13B:
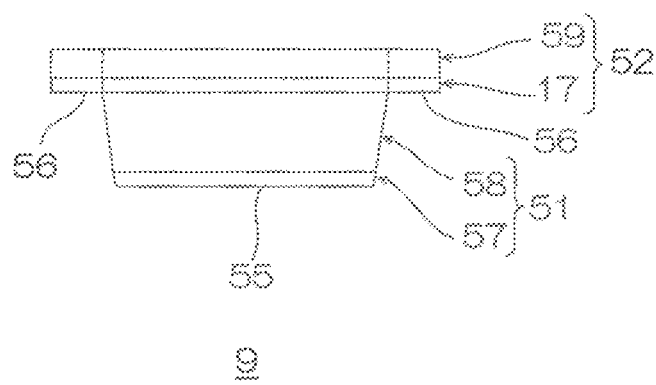

In the same manner as that in the first embodiment, as referred to the phantom line of FIG. 13B, when projected in the up-down direction, the imaging element connecting terminal 9 integrally includes the inner side portion 55 that is included in the outermost shape of the imaging element opening portion 41 and the outer side portion 56 (brim portion) that extends from the inner side portion 55 outwardly. That is, in the imaging element connecting terminal 9, the terminal connecting portion 51 (the gold plating layer 57 and the filling portion 58) and the inner peripheral portion of the wire connecting portion 52 (the me till thin film 17 and the wire connecting main body portion 59) that is continuous thereto in the up-down direction correspond to the inner side portion 55. The peripheral end portion of the wire connecting portion 52 that is in contact with the upper surface of the base insulating layer 4 corresponds to the outer side portion 56.

In the same manner as that in the first embodiment, the lower surface (exposed surface) of the terminal connecting portion 51, that is, the lower surface of the gold plating layer 57 is generally flush with the lower surface of the base insulating layer 4. In the imaging element connecting terminal 9, the upper surface of the inner side portion 55 is generally flush with the upper surface of the outer side portion 56.

Figure 12:
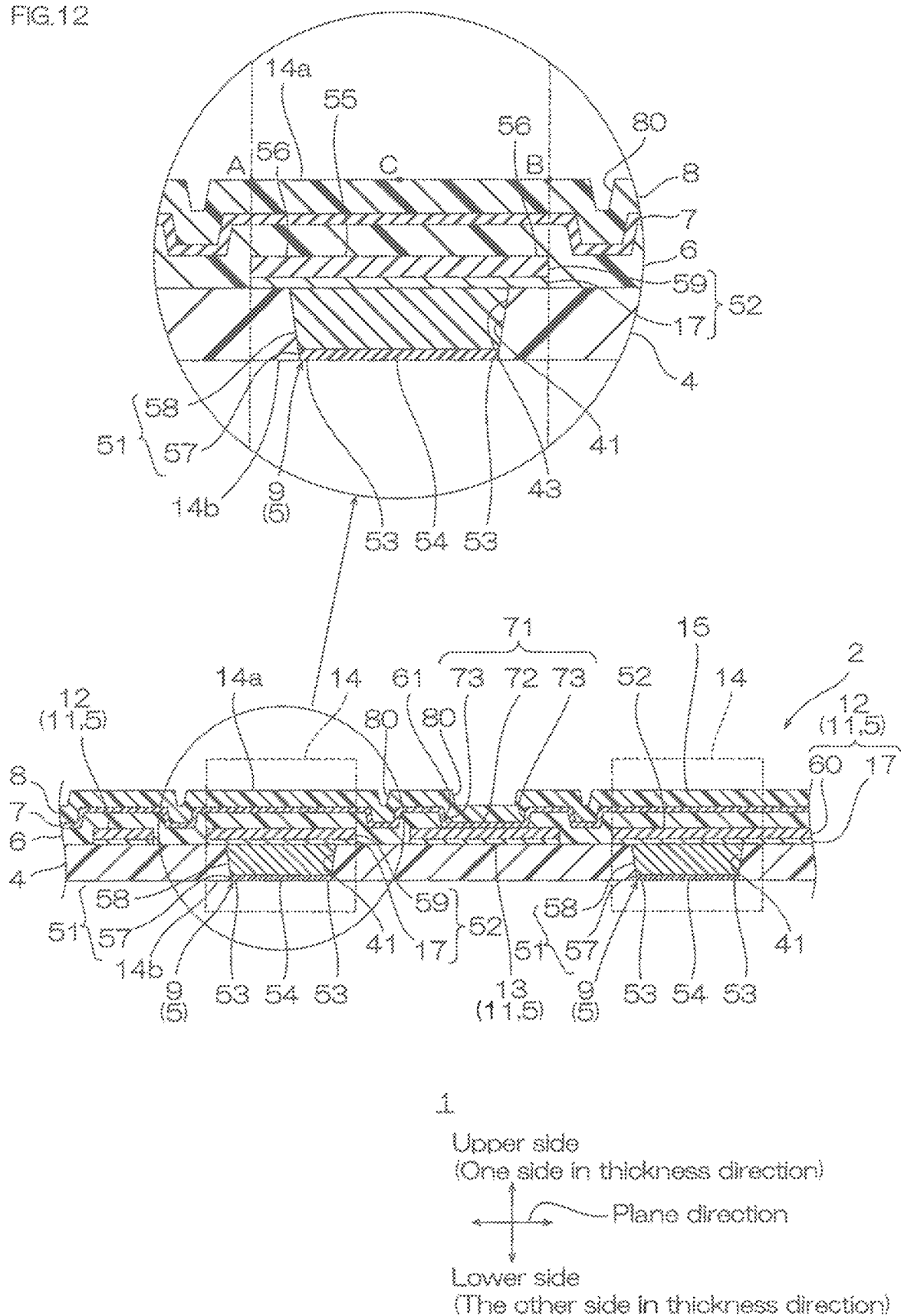
FIG. 12 shows a side cross-sectional view of a second embodiment of the imaging element-mounting board of the present invention.

As shown in FIG. 12, the plurality of wires 11 include the plurality of connecting wires 12 and the plurality of ground wires 13. Each of the plurality of wires 11 includes the metal thin film 17 at the lowermost portion thereof. That is, each of the plurality of wires 11 (the connecting wire 12 and the ground wire 13) includes the metal thin film 17 and a wire main body portion 60 that is disposed at the upper side thereof.

The thickness of the wire main body portion 60 is the same as that of the wire connecting main body portion 59, and the wire main body portion 60 has a thickness of, for example, 1 μm or more, preferably 3 μm or more, and for example, 15 μm or less, preferably 10 μm or less, more preferably 8 μm or less.

In the same manner as that in the first embodiment, the upper surface of the connecting wire 12 is flush with the upper surface of the wire connecting portion 52. The upper surface 14a of the terminal region 14 is generally flat.

2. Method for Producing Imaging Element-Mounting Board

As shown in FIGS. 14A to 15J, the mounting board 1 of the second embodiment is, for example, obtained by sequentially carrying out the metal supporting plate preparing step, the base insulating layer forming step, a gold plating layer forming step, a filling portion forming step, the metal thin film forming step, the photo resist forming step, the conductive pattern forming step, the photo resist and metal thin film removing step, the first cover insulating layer forming step, the shield layer forming step, the second cover insulating layer forming step, and the metal supporting plate removing step. The same step as that of the first embodiment is omitted.

As referred to FIG. 4A, in the metal supporting plate preparing step, the metal supporting plate 16 is prepared. As referred to FIG. 4B, in the base insulating layer forming step, the base insulating layer 4 is formed on the upper surface of the metal supporting plate 16. These steps are the same as those of the first embodiment.

As shown in FIG. 14A, in the gold plating layer forming step, the gold plating layer 57 is formed in a portion that is exposed from the imaging element opening portion 41 on the upper surface of the gold supporting plate 16.

In the gold plating layer forming step, for example, a plating method such as electrolytic plating and electroless plating is used. Preferably, electrolytic plating is used. In this case, the metal supporting plate 16 in which the base insulating layer 4 is formed is immersed in the gold plating bath, and next electricity is supplied to a portion that is exposed from the imaging element opening portion 41 of the base insulating layer 4 on the upper surface of the metal supporting plate 16 via the metal supporting plate 16 by using a power supply portion that is not shown.

As shown in FIG. 14B, in the filling portion forming step, the filling portion 58 is formed on the upper surface of the gold plating layer 57.

In the filling portion forming step, for example, a plating method such as electrolytic plating and electroless plating is used. Preferably, electrolytic plating is used. For example, the metal supporting plate 16 in which the gold plating layer 57 is formed is immersed in desired plating bath (for example, copper plating bath, nickel plating bath), and next, the electricity is supplied to the upper surface of the gold plating layer 57 via the metal supporting plate 16 and the gold plating layer 57 by using the power supply portion that is not shown. In the filling portion forming step, the electricity is supplied until the upper surface of the filling portion 58 is generally flush with the upper surface of the base insulating layer 4.

In this manner, in the imaging element opening portion 41, the terminal connecting portion 51 including the gold plating layer 57 and the filling portion 58 (that is, the peripheral end portion 53 and the solid portion 54) is formed.

As shown in FIG. 14C, in the metal thin film forming step, the metal thin film 17 (seed film) is formed on the upper surface of the base insulating layer 4, the upper surface of the filling portion 58, and a portion that is exposed from the external component opening portion 42 on the upper surface of the metal supporting plate 16.

The metal thin film forming step is the same as that of the first embodiment. As the metal thin film 17, preferably, in view of adhesive properties with the base insulating layer 4, chromium is used. Preferably, the metal thin film 17 (sputtering film) is formed by sputtering.

As shown in FIG. 14D, in the photo resist forming step, the photo resist 18 is formed on the metal thin film 17. The step is the same as that of the first embodiment.

As shown in FIG. 14E, in the conductive pattern forming step, the conductive pattern 5 is formed in a portion that is exposed from the photo resist 18 on the upper surface of the metal thin film 17.

To be specific, in the conductive pattern forming step, for example, the electrolytic plating in which the electricity is supplied from the metal thin film 17 is carried out. In the second embodiment, in the electrolytic plating, a general plating method that is not a via-fill plating method is used.

In this manner, the plating layer 19 (the wire connecting main body portion 59 and the wire main body portion 60) grows from the metal thin film 17, so that the wire connecting portion 52 and the wire 11 are formed. At this time, the upper surface of the wire connecting main body portion 59 is formed so as to be flush with the upper surface of the wire main body portion 60.

As a result, the conductive pattern 5 having the imaging element connecting terminal 9, the external component connecting terminal 10, and the wire 11 is formed.

As shown in FIG. 15F, in the photo resist and metal thin film removing step, the photo resist 18 and the metal thin film 17 are removed.

As shown in FIG. 15G, in the first cover insulating layer forming step, the first cover insulating layer 6 is disposed on the upper surfaces of the conductive pattern 5 and the base insulating layer 4.

As shown in FIG. 15H, in the shield layer forming step, the shield layer 7 is formed on the first cover insulating layer 6.

As shown in FIG. 15I, in the second cover insulating layer forming step, the second cover insulating layer 8 is disposed on the upper surface of the shield layer 7.

As shown in FIG. 15J, in live metal supporting plate removing step, the metal supporting plate 16 is removed.

The steps shown in FIGS. 15F to 15J are the same as those of the first embodiment.

In this manner, the mounting board 1 including the base insulating layer 4, the conductive pattern 5, the first cover insulating layer 6, the shield layer 7, and the second cover insulating layer 8 is obtained.

3. Imaging Device

Figure 6:
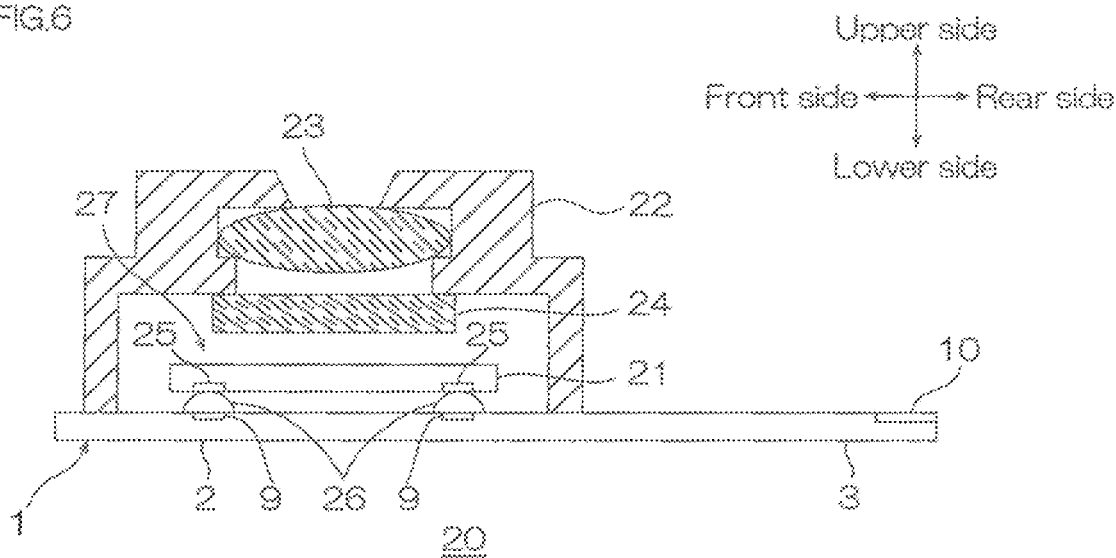
FIG. 6 shows an imaging device including the imaging element-mounting board shown in FIG. 1.

As referred to FIG. 6, the imaging device 20 including the mounting board 1 of the second embodiment is the same as the imaging device 20 including the mounting board 1 of the first embodiment.

The mounting board 1 of the second embodiment can achieve the same function and effect as that of the mounting board 1 of the first embodiment.

In the second embodiment, the imaging element connecting terminal 9 further includes the gold plating layer 57 that is disposed at the inside of the imaging element opening portion 41 and exposed from the lower surface thereof.

Thus, the durability of the imaging element connecting terminal 9 is excellent. The gold plating layer 57 has excellent etching resistance, so that the imaging element connecting terminal 9 can be surely formed. To be specific, in the metal supporting plate removing step, that is, in the step of etching the metal supporting plate 16 and exposing the lower surface of the imaging element connecting terminal 9, the etching to the inside of the filling portion 58 (the solid portion 54) can be suppressed, and the erosion of the filling portion 58 can be suppressed.

Furthermore, the gold plating layer 57 is disposed at the inside of the imaging element opening portion 41, so that the protrusion of the gold plating layer 57 on the lower surface of the mounting board 1 can be suppressed. To be specific, the gold plating layer 57 is generally flush with the lower surface of the base insulating layer 4, and the lower surface 14b of the terminal region 14 of the mounting board 1 can be formed flat. Thus, the mounting properties of the imaging element 21 are excellent.

4. Modified Example

A modified example of the mounting board 1 of the second embodiment is described with reference to FIGS. 16 to 17. In the modified example, the same reference numerals are provided for members corresponding to each of those in the above-described embodiment shown in FIGS. 2 and 12, and their detailed description is omitted.

(1) In the embodiment shown in FIG. 12, the upper surface 14a of the terminal region 14 is formed so that the entire surface thereof is formed generally flat. Alternatively, for example, as shown in FIG. 16, a part of the upper surface 14a of the terminal region 14 may form the minor recessed portion 81 and may not be formed generally flat.

In this case, the upper surface of the inner side portion 55 is not generally flush with the upper surface of the outer side portion 56, and positioned at the lower side with respect to the upper surface of the outer side portion 56. The depth of the minor recessed portion 81 is shallower than that of the external region recessed portion 80. That is, the bottom portion of the minor recessed portion 81 is positioned at the upper side with respect to that of the external region recessed portion 80.

The peripheral end portion 53 and the solid portion 54 filling the imaging element opening portion 41 consist of the gold plating layer 57, the filling portion 58, the metal thin film 17, and the lower portion of the wire connecting portion 52.

The embodiment shown in FIG. 16 can achieve the same function and effect as that of the embodiment shown in FIG. 12.

In view of furthermore surely capable of suppressing the deformation of the terminal region 14 of the mounting board 1, the embodiment shown in FIG. 12 is used.

(2) In the embodiment shown in FIG. 12, the mounting board 1 includes the base insulating layer 4, the conductive pattern 5, the first cover insulating layer 6, the shield layer 7, and the second cover insulating layer 8. Alternatively, for example, as shown in FIG. 17, the mounting board 1 may not include the shield layer 7 and the second cover insulating layer 8.

The embodiment shown in FIG. 17 can achieve the same function and effect as that of the embodiment shown in FIG. 12.

In view of capable of shielding the electromagnetic waves generated from the outside by the shield layer 7 and improving the reliability as the imaging device 20, preferably, the embodiment shown in FIG. 12 is used.

(3) In the mounting board 1 shown in FIG. 12, in the conductive pattern 5 (the imaging element connecting terminal 9, the external component connecting terminal 10, the wire 11), the material for the plating layer 19 is different from the material for the metal thin film 17, and a two-layer structure of the plating layer 19 and the metal thin film 17 (to be specific, the two-layer structure of the metal thin film 17 and the wire connecting main body portion 59, the two-layer structure of the metal thin film 17 and the wire main body portion 60) is provided. Alternatively, for example, though not shown, in the conductive pattern 5, the material for the plating layer 19 and the material for the metal thin film 17 are the same (for example, copper), and may be completely unified to be one layer.

In the imaging element connecting terminal 9, the filling portion 58, the metal thin film 17, and the wire connecting main body portion 59 are made from the same material (for example, copper), and a portion consisting of these may be completely unified to be one layer.

(4) In the embodiment shown in FIG. 12, the shield layer 17 is provided. Alternatively, for example, though not shown, the shield layer 17 may be the second conductive layer (described above) such as wire and terminal.

(5) In the mounting board 1 shown in FIG. 12, the wire 11 includes the ground wire 13. Alternatively, for example, though not shown, the wire 11 may not include the ground wire 13.

Another Embodiment of Wiring Circuit Board

In the embodiments shown in FIGS. 1 to 17, the imaging element-mounting board 1 for mounting the imaging dement is illustrated as a wiring circuit board. However, the wiring circuit board of the present invention is not limited to this use, and can be used as a wiring circuit board for mounting an electronic dement other than the imaging element (for example, piezoelectric element, light emitting element).

While the illustrative embodiments of the present invention are provided in the above description, such is for illustrative purpose only and it is not to be construed as limiting the scope of the present invention. Modification and variation of the present inversion that will be obvious to those skilled in the art is to be covered by the following claims.

INDUSTRIAL APPLICABILITY

The wiring circuit board of the present invention can be applied in various industrial products, and for example, cart be preferably used for imaging devices such as camera module.

DESCRIPTION OF REFERENCE NUMERALS

1 Mounting board
4 Base insulating layer
5 Conductive pattern
6 First cover insulating layer
7 Shield layer
8 Second cover insulating layer
9 Imaging element connecting terminal
12 Connecting wire
14 Terminal region
14a Upper surface of terminal region
20 Imaging device
21 Imaging element
41 Imaging element opening portion
43 Inner side surface
51 Terminal connecting portion
52 Wire connecting portion
53 Peripheral end portion 54 Solid portion
55 Inner side portion
56 Outer side portion
57 Gold plating layer

The invention claimed is:

1. A wiring circuit board comprising:
a first insulating layer,
a terminal,
a second insulating layer disposed at one side in a thickness direction of the terminal,
a wire continuous to the terminal in a direction crossing the thickness direction,
a shield layer disposed at one side in the thickness direction of the second insulating layer, the shield layer being made of a conductor for shielding electromagnetic waves, and
a third insulating layer disposed at one side in the thickness direction of the shield layer, wherein
the first insulating layer has an opening portion passing through the first insulating layer in the thickness direction and having the opening cross-sectional area increasing as being closer to one side in the thickness direction;
the terminal has
a peripheral end portion in contact with an inner side surface of the first insulating layer, the inner side surface forming the opening portion and
a solid portion integrally disposed with the peripheral end portion at the inner side of the peripheral end portion;
the peripheral end portion and the solid portion fill the entire opening portion; and
the terminal further includes a gold plating layer disposed at the inside of the opening portion and exposed from the other-side surface in the thickness direction of the opening portion.

2. The wiring circuit board according to claim 1, wherein the other-side surface in the thickness direction of the terminal is generally flush with the other-side surface in the thickness direction of the first insulating layer.

3. The wiring circuit board according to claim 1, wherein a one-side surface in the thickness direction of the wiring circuit board that is, when the terminal is projected in the thickness direction, overlapped with the terminal is generally flat.

4. The wiring circuit board according to claim 1, wherein the terminal includes a wire connecting portion integrally disposed with the peripheral end portion and the solid portion at one side in the thickness direction of the peripheral end portion and the solid portion, and
a one-side surface in the thickness direction of the wire is generally flush with a one-side surface in the thickness direction of the wire connecting portion.

5. The wiring circuit board according to claim 1, wherein the terminal includes
an inner side portion included in the opening portion when projected in the thickness direction and
an outer side portion extending from the inner side portion outwardly, and
a one-side surface in the thickness direction of the inner side portion is generally flush with a one-side surface in the thickness direction of the outer side portion.

6. The wiring circuit board according to claim 1, wherein the terminal has a thickness of 30 µm or less.

7. The wiring circuit board according to claim 1 used for mounting an imaging element.

8. An imaging device comprising:
the wiring circuit board according to claim 1 and
an imaging element mounted on the wiring circuit board.

* * * * *